US012720805B2

(12) United States Patent
Park et al.

(10) Patent No.: US 12,720,805 B2
(45) Date of Patent: Aug. 25, 2026

(54) SEMICONDUCTOR DEVICES INCLUDING CHANNEL LAYERS HAVING SIDE SURFACES WITH (111) CRYSTAL ORIENTATION

(71) Applicant: SAMSUNG ELECTRONICS CO., LTD., Suwon-si (KR)

(72) Inventors: Beomjin Park, Suwon-si (KR); Myunggil Kang, Suwon-si (KR); Dongwon Kim, Suwon-si (KR); Younggwon Kim, Suwon-si (KR); Hyumin Yoo, Suwon-si (KR); Soojin Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 434 days.

(21) Appl. No.: 18/231,841

(22) Filed: Aug. 9, 2023

(65) Prior Publication Data

US 2024/0096995 A1 Mar. 21, 2024

(30) Foreign Application Priority Data

Sep. 21, 2022 (KR) ........................ 10-2022-0119295

(51) Int. Cl.

| | |
|---|---|
| ***H10D 30/67*** | (2025.01) |
| ***H10D 30/43*** | (2025.01) |
| ***H10D 62/10*** | (2025.01) |
| ***H10D 62/13*** | (2025.01) |
| ***H10D 64/01*** | (2025.01) |

(52) U.S. Cl.

CPC ......... *H10D 30/6735* (2025.01); *H10D 30/43* (2025.01); *H10D 30/6757* (2025.01); *H10D 62/121* (2025.01); *H10D 62/151* (2025.01); *H10D 64/017* (2025.01)

(58) Field of Classification Search

CPC ............... H10D 30/6735; H10D 30/43; H10D 30/6757; H10D 30/797

See application file for complete search history.

(56) References Cited

U.S. PATENT DOCUMENTS

| | | | |
|---|---|---|---|
| 10,177,235 | B2 | 1/2019 | Balakrishnan et al. |
| 10,504,900 | B2 | 12/2019 | Hashemi et al. |
| 11,069,681 | B2 | 7/2021 | Shin et al. |
| 11,183,561 | B2 | 11/2021 | Cheng et al. |

(Continued)

*Primary Examiner* — Davienne N Monbleau
*Assistant Examiner* — Emily Farmer
(74) *Attorney, Agent, or Firm* — Muir Patent Law, PLLC

(57) ABSTRACT

A semiconductor device, may include an active region extending in a first direction; a plurality of channel layers on the active region to be spaced apart from each other; a gate structure, surrounding the plurality of channel layers, respectively; and source/drain regions on the active region on at least one side of the gate structure, and contacting the plurality of channel layers, wherein the gate structure may include an upper portion on an uppermost channel layer among the plurality of channel layers and lower portions between each of the plurality of channel layers in a region vertically overlapping the plurality of channel layers, wherein a width of each of the plurality of channel layers in the first direction may be less than a width of lower portions of the gate structure, adjacent to the respective channel layers among the lower portions of the gate structure in the first direction.

20 Claims, 24 Drawing Sheets

(56) References Cited

U.S. PATENT DOCUMENTS

| | | | | |
|---|---|---|---|---|
| 11,195,913 | B2 | 12/2021 | Van Dal et al. | |
| 11,348,835 | B2 | 5/2022 | Lin et al. | |
| 2006/0049429 | A1 | 3/2006 | Kim et al. | |
| 2014/0001441 | A1 | 1/2014 | Kim et al. | |
| 2020/0020774 | A1* | 1/2020 | Lee | H10D 62/121 |
| 2020/0227534 | A1* | 7/2020 | Chiang | H10D 30/6735 |
| 2020/0365586 | A1* | 11/2020 | Shin | H10D 30/62 |
| 2022/0037465 | A1* | 2/2022 | Lin | H10D 30/6757 |
| 2022/0384202 | A1* | 12/2022 | Lin | H01L 21/31138 |

* cited by examiner

SEMICONDUCTOR DEVICES INCLUDING CHANNEL LAYERS HAVING SIDE SURFACES WITH (111) CRYSTAL ORIENTATION

CROSS-REFERENCE TO RELATED APPLICATION

This application claims priority under 35 U.S.C. § 119 to Korean Patent Application No. 10-2022-0119295, filed on Sep. 21, 2022, in the Korean Intellectual Property Office, the disclosure of which is incorporated in its entirety herein by reference.

BACKGROUND

1. Field

Embodiments relates to semiconductor devices.

2. Description of the Related Art

As demand for high performance, high speed, and multifunctionality of semiconductor devices increases, a degree of integration of semiconductor devices is increasing. In this regard, it is necessary to implement patterns having a fine width or a fine distance. In addition, in order to overcome limitations in operating characteristics due to size reductions of a planar metal oxide semiconductor field effect transistor (MOSFET), efforts are being made to develop a semiconductor device having a three-dimensional (3D) structured channel.

SUMMARY

According to an aspect of embodiments, a semiconductor device, may include: an active region extending on a substrate in a first direction; a plurality of channel layers on the active region to be spaced apart from each other in a direction, perpendicular to an upper surface of the substrate; a gate structure crossing the active region and the plurality of channel layers on the substrate and respectively surrounding the plurality of channel layers, and extending in a second direction; and source/drain regions on the active region on at least one side of the gate structure, and contacting the plurality of channel layers, wherein the gate structure may include an upper portion on an uppermost channel layer among the plurality of channel layers and lower portions between each of the plurality of channel layers in a region vertically overlapping the plurality of channel layers, wherein a width of each of the plurality of channel layers in the first direction may be less than a width of lower portions, adjacent to the respective channel layers among the lower portions of the gate structure in the first direction.

According to an aspect of embodiments, a semiconductor device, may include: an active region extending on a substrate in a first direction; a plurality of channel layers on the active region to be spaced apart from each other in a direction, perpendicular to an upper surface of the substrate; a gate structure crossing the active region and the plurality of channel layers on the substrate and respectively surrounding the plurality of channel layers, and extending in a second direction; and source/drain regions on the active region on at least one side of the gate structure, and contacting the plurality of channel layers, wherein at least a portion of surfaces at which the source/drain regions and the plurality of channel layers contact each other may have a (111) crystal orientation.

According to an aspect of embodiments, a semiconductor device, may include: an active region extending on a substrate in a first direction; a plurality of channel layers on the active region to be spaced apart from each other in a direction, perpendicular to an upper surface of the substrate; a gate structure crossing the active region and the plurality of channel layers on the substrate and respectively surrounding the plurality of channel layers, and extending in a second direction; and source/drain regions on the active region on at least one side of the gate structure, and contacting the plurality of channel layers, wherein the gate structure may include an upper portion on an uppermost channel layer among the plurality of channel layers and a lower portion below each of the plurality of channel layers, in a region vertically overlapping the plurality of channel layers, wherein a width of each of the plurality of channel layers in the first direction, on a central level of each of the plurality of channel layers may be less than a width between outer side surfaces of the source/drain regions, adjacent thereto in the first direction, on a central level of each of the lower portions of the gate structure, wherein at least a portion of surfaces at which the source/drain regions and the plurality of channel layers contact each other may have a (111) crystal orientation, wherein a lowermost portion of the source/drain regions may be disposed on a level, lower than that of a lowermost portion of the lower portions of the gate structure.

BRIEF DESCRIPTION OF DRAWINGS

Features will become apparent to those of skill in the art by describing in detail exemplary embodiments with reference to the attached drawings, in which.

DETAILED DESCRIPTION

Figure 1:
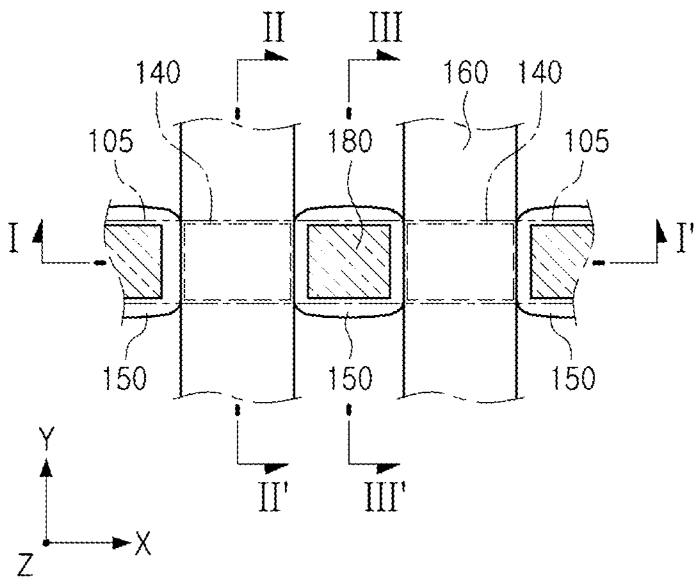
FIG. 1 is a plan view illustrating a semiconductor device according to example embodiments.
Figure 2A:
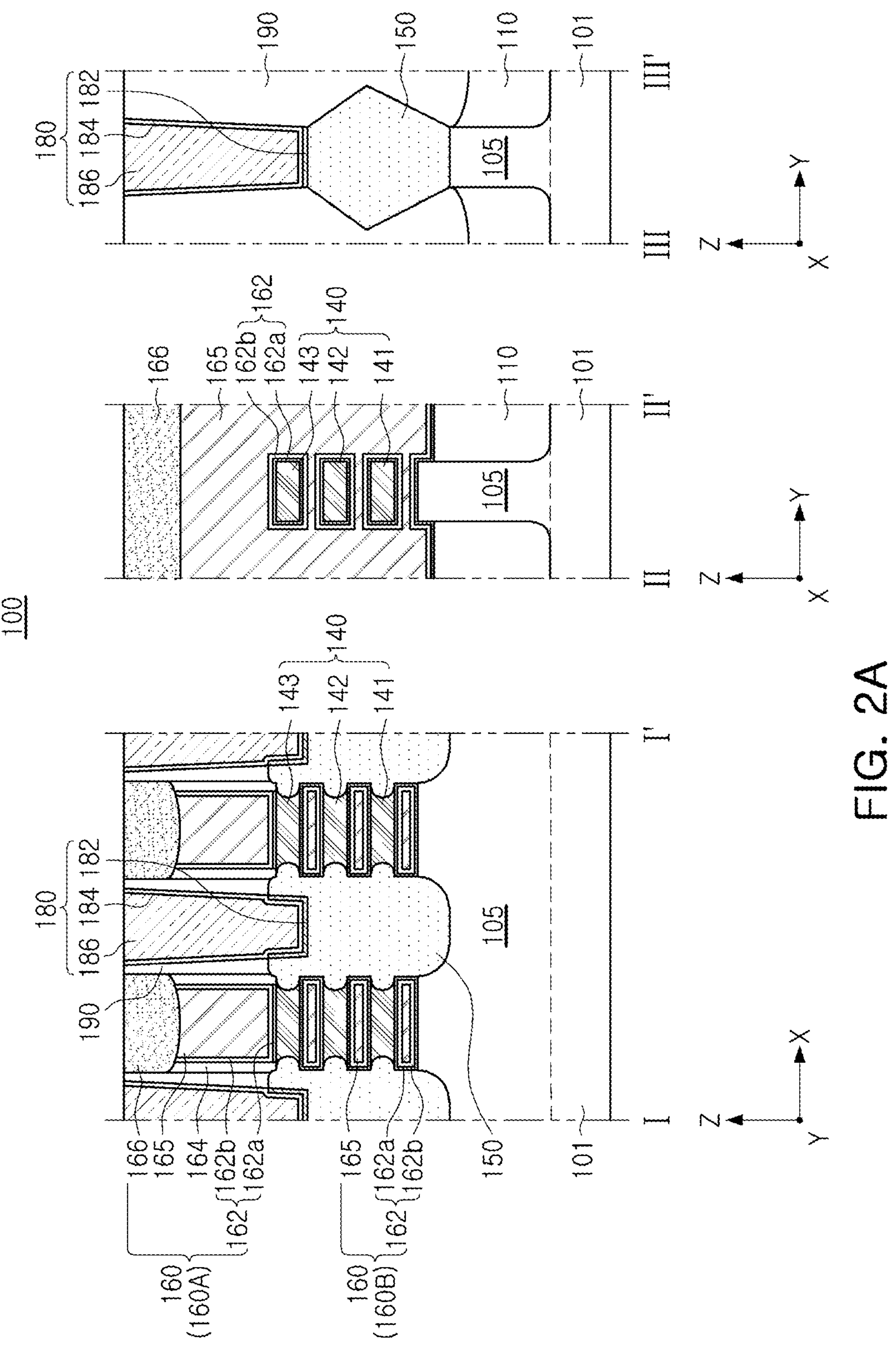
FIG. 2A is a cross-sectional view illustrating a semiconductor device according to example embodiments.

FIG. 1 is a plan view illustrating a semiconductor device according to example embodiments. FIG. 2A is a cross-sectional view along lines I-I', and of FIG. 1, respectively. For convenience of description, only major components of the semiconductor device are illustrated in FIGS. 1 and 2A.

Referring to FIGS. 1 and 2A, a semiconductor device 100 may include a substrate 101, an active region 105 on the substrate 101, a channel structure 140 including a plurality of channel layers 141, disposed on the active region 105 to be vertically spaced apart from each other, a source/drain region 150, in contact with the plurality of channel layers 141, 142, and 143, a gate structure 160 extending to cross the active region 105, and a contact plug 180 connected to the source/drain region 150. The semiconductor device 100 may further include device isolation layers 110 and an interlayer insulating layer 190. The gate structure 160 may include gate spacer layers 164, first and second gate dielectric layers 162*a* and 162*b*, a gate electrode 165, and a gate capping layer 166.

In the semiconductor device 100, the active region 105 may have a fin structure, and the gate electrode 165 may be disposed between the active region 105 and the channel structure 140, between the plurality of channel layers 141, 142, and 143 of the channel structures 140, and above the channel structure 140. Accordingly, the semiconductor device 100 may include a gate-all-around type field effect transistor by the channel structure 140, the source/drain region 150, and the gate structure 160, i.e., a Multi Bridge Channel Field Effect Transistor (MBCFET™). The transistor may be, e.g., an NMOS transistor.

The substrate 101 may have an upper surface extending in X- and Y-directions. The substrate 101 may include or be formed of a semiconductor material, e.g., a group IV semiconductor, a group III-V compound semiconductor, or a group II-VI compound semiconductor. For example, the group IV semiconductor may include silicon, germanium, or silicon-germanium. The substrate 101 may be provided as a bulk wafer, an epitaxial layer, a Silicon On Insulator (SOI) layer, a Semiconductor On Insulator (SeOI) layer, or the like.

The device isolation layer 110 may define the active region 105 on the substrate 101. The device isolation layer 110 may be formed by, e.g., a shallow trench isolation (STI) process. According to example embodiments, the device isolation layer 110 may further include a region having a downwardly oriented step, e.g., extending more deeply toward the substrate 101. The device isolation layer 110 may partially expose an upper portion of the active region 105. According to example embodiments, the device isolation layer 110 may have a curved upper surface having a higher level adjacently to the active region 105. The device isolation layer 110 may be formed of an insulating material, e.g., an oxide, a nitride, or a combination thereof.

The active region 105 may be defined by the device isolation layer 110 within the substrate 101, and may be disposed to extend in a first direction, e.g., the X direction. The active region 105 may have a structure protruding from the substrate 101. An upper end of the active region 105 may protrude to a predetermined height from an upper surface of the device isolation layer 110. The active region 105 may be made of a portion of the substrate 101, or may include an epitaxial layer grown from the substrate 101. For example, the active region 105 on the substrate 101 may be partially recessed on both sides of the gate structure 160, and a source/drain region 150 may be disposed on the recessed active region 105. The active region 105 may include impurities or doped regions including impurities.

The channel structure 140 may include two or more channel layers, e.g., first to third channel layers 141, 142, and 143, on the active region 105 and spaced apart from each other in a direction perpendicular to an upper surface of the active region 105, e.g., in a Z direction. The first to third channel layers 141, 142, and 143 may be connected to the source/drain region 150, and may be spaced apart from the upper surface of the active region 105. For example, the first to third channel layers 141, 142, and 143 may have the same or a similar width as the active region 105 in the second direction (e.g., the Y-direction), and may have the same or similar width as the gate structure 160 in the first direction (e.g., the X-direction). In another example, the first to third channel layers 141, 142, and 143 may have reduced widths such that side surfaces thereof are located below the gate structure 160 in the first direction (e.g., X-direction). Accordingly, an area in which the source/drain region 150 and the first to third channel layers 141, 142, and 143 contact each other may be reduced.

The first to third channel layers 141, 142, and 143 may be formed of a semiconductor material, and may include, e.g., silicon (Si). For example, the first to third channel layers 141, 142, and 143 may be formed of the same material as the substrate 101. The number and shape of the channel layers constituting one channel structure 140 may be variously changed in example embodiments, e.g., the channel structure 140 may further include a channel layer disposed on the upper surface of the active region 105.

The source/drain region 150 may be disposed on the active region 105 on both sides of the plurality of channel layers, e.g., the source/drain region 150 may be at each of opposite sides of each stack of the first to third channel layers 141, 142, and 143. The source/drain region 150 may be provided as a source region or a drain region of a transistor. For example, the source/drain region 150 may be disposed by partially recessing an upper portion of the active region 105. In another example, the source/drain region 150 may be disposed on the active region 105 without a recess or fully in a recess.

Outer side surfaces of the source/drain regions 150 may protrude toward the first to third channel layers 141, 142, and 143. For example, as illustrated in FIG. 2A, opposite side surfaces of the source/drain regions 150 may include protrusions spaced apart from each other along the Z-direction, such that each of the protrusions may protrude toward a corresponding one of the first to third channel layers 141, 142, and 143, e.g., in a one-to-one correspondence. As such, the source/drain regions 150 may have a non-constant width in the first direction (e.g., the X-direction), e.g., a width in the X-direction along a portion with the protrusions at a level of a channel layer may be greater than a width in the X-direction along a portion without the protrusions at a level of a lower portion 160B of the gate electrode 165. For this reason, the source/drain regions 150 may include a protruding portion, protruding toward the first to third channel layers 141, 142, and 143 at the same level as the first to third channel layers 141, 142, and 143. Surfaces at which the source/drain regions 150 and the first and second gate dielectric layers 162*a* and 162*b* contact each other may have a rounded shape.

The source/drain region 150 may include epitaxial layers disposed along a side surface of each of the first to third channel layers 141, 142, and 143. For example, the source/drain region 150 may include a plurality of epitaxial layers as shown in FIGS. 2C and 2D described later. The source/drain region 150 may be a semiconductor layer including, e.g., silicon (Si) and/or germanium (SiGe). The source/drain region 150 may include impurities of different types and/or concentrations. For example, the source/drain regions 150 may include n-type doped silicon (Si) and/or p-type doped silicon germanium (SiGe). In example embodiments, the source/drain region 150 may include a plurality of regions including different concentrations of elements and/or doping elements. For example, the source/drain region 150 may have a circular, elliptical, polygonal (e.g., rectangular, pentagonal, hexagonal, etc.) or similar shape in a cross-section along the second direction (e.g., the Y-direction).

The gate structure 160 may be disposed to extend in one direction, e.g., in the Y-direction, crossing the active region 105 and the first to third channel layers 141, 142, and 143 above the active region 105 and the first to third channel layers 141, 142, and 143. Channel regions of transistors may be formed in the active region 105 and the first to third channel layers 141, 142, and 143 crossing the gate structure 160. The gate structure 160 may include an upper portion 160A disposed on an uppermost channel layer among the first to third channel layers 141, 142, and 143, and lower portions 160B disposed below each of the first to third channel layers 141, 142, and 143, in a region vertically overlapping the first to third channel layers 141, 142, and 143. According to an example embodiment, the lowermost portions of the source/drain regions 150 may be disposed on a level lower than that of a lowermost one of the lower portions 160B of the gate structure 160. The gate structure 160 may include the gate electrode 165, first and second gate dielectric layers 162*a* and 162*b* between the gate electrode 165 and the first to third channel layers 141, 142, and 143, the gate spacer layers 164 one side surfaces of the gate electrode 165, and the gate capping layer 166 on an upper surface of the gate electrode 165.

The first and second gate dielectric layers 162*a* and 162*b* may be disposed between the active region 105 and the gate electrode 165, and between each of the first to third channel layers 141, 142, and 143 and the gate electrode 165. The first and second gate dielectric layers 162*a* and 162*b* may be disposed to cover at least a portion of surfaces of the gate electrode 165. For example, in the upper portion 160A of the gate structure 160, the first gate dielectric layer 162*a* may be disposed on a lower surface of the second gate dielectric layer 162*b* on a lower surface of the gate electrode 165. The second gate dielectric layer 162*b* may be disposed to surround all surfaces of the gate electrode 165 except for an uppermost surface. For example, the first and second gate dielectric layers 162*a* and 162*b* may extend between the gate electrode 165 and the gate spacer layers 164. The first and second gate dielectric layers 162*a* and 162*b* may have the same or different thicknesses.

The first and second gate dielectric layers 162*a* and 162*b* may be made of the same material, or may include different materials. The first and second gate dielectric layers 162*a* and 162*b* may include, e.g., oxide, nitride, or a high-κ material. The high-κ material refers to a dielectric material having a dielectric constant higher than that of silicon oxide ($SiO_2$). The high dielectric constant material may be at least one of, e.g., aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide (L $LaHf_xO_y$), hafnium aluminum oxide ($HfAl_xO_y$), and praseodymium oxide ($Pr_2O_3$).

The gate electrode 165 may be disposed to fill a gap between the first to third channel layers 141, 142, and 143 above the active region 105 and to extend above the first to third channel layers 141, 142, and 143. The gate electrode 165 may be spaced apart from the first to third channel layers 141, 142, and 143 by the first and second gate dielectric layers 162*a* and 162*b*. The gate electrode 165 may include a conductive material. For example, the gate electrode 165 may include a metal nitride, e.g., titanium nitride (TiN), tantalum nitride (TaN), or tungsten nitride (WN), a metal material, e.g., aluminum (Al), tungsten (W), or molybdenum (Mo), and/or a semiconductor material, e.g., doped polysilicon.

The gate electrode 165 may be composed of two or more multi-layers. The gate spacer layers 164 may be disposed on both, e.g., opposite, sides of the gate electrode 165. The gate spacer layers 164 may insulate the source/drain regions 150 and the gate electrode 165. The gate spacer layers 164 may have a multi-layer structure according to example embodiments. The gate spacer layers 164 may include at least one of, e.g., an oxide, a nitride, an oxynitride, and a low-κ dielectric.

The gate capping layer 166 may be disposed above the gate electrode 165. The gate capping layer 166 may be disposed to extend along an upper surface of the gate electrode 165 in the second direction (e.g., in the Y-direction). Side surfaces of the gate capping layer 166 may be surrounded by the gate spacer layers 164. For example, the upper surface of the gate capping layer 166 may be substantially coplanar with the upper surfaces of the gate spacer layers 164. For example, the gate capping layer 166 may include an oxide (e.g., SiO or SiOC), a nitride (e.g., SiN or SiCN), and/or an oxynitride (e.g., SiON or SiOCN).

According to an example embodiment, a minimum width between surfaces at which at least one of the first to third channel layers 141, 142, and 143 and the source/drain regions 150 contact each other in the first direction (e.g., the X-direction) may be less than a maximum width between outer side surfaces of the source/drain regions 150 at substantially the same level as the lower portions 160B of the gate structure 160 along the first direction (e.g., the X-direction). For example, a width of each of the first to third channel layers 141, 142, and 143 in the first direction (e.g., the X-direction) on a central level of each of the first to third channel layers 141, 142, and 143 may be less than a width between outer side surfaces of the source/drain region 150 at a central level of each of the lower portions 160B of the gate structure 160.

According to example embodiments, in a region in which the gate structure 160 and the first to third channel layers 141, 142, and 143 vertically overlap, a minimum width between surfaces at which at least one of the first to third channel layers 141, 142, and 143 and the source/drain regions 150 contact each other in the first direction (e.g., the X-direction) may be less than a maximum width of the gate electrode 165 of each of the lower portions 160B of the gate structure 160 in the first direction (e.g., the X-direction). For example, a minimum width in the X-direction between facing surfaces of each of the first to third channel layers 141, 142, and 143 may be less than a maximum width in the X-direction between facing surfaces of each of the lower portions 160B that vertically overlap the first to third channel layers 141, 142, and 143. According to example embodiments, the width of each of the first to third channel layers 141, 142, and 143 in the first direction (e.g., the X-direction) may be less than the width of the lower portions 160B, adjacent to each of the first to third channel layers 141, 142, and 143, among the lower portions 160B of the gate structure 160. Accordingly, it is possible to provide a semiconductor device having improved electrical characteristics.

The interlayer insulating layer 190 may be disposed to cover the source/drain region 150, the gate structure 160, and the device isolation layer 110. The interlayer insulating layer 190 may include, e.g., at least one of oxide, nitride, oxynitride, and a low-κ dielectric.

The contact plugs 180 may pass through at least a portion of the interlayer insulating layer 190 to contact the source/drain region 150, and apply an electrical signal to the source/drain region 150. The contact plugs 180 may be disposed on the source/drain region 150, and may be disposed to have a longer length in the second direction (e.g., the Y-direction) than the source/drain region 150 according to example embodiments. For example, the contact plugs 180 may have inclined side surfaces in which a width of the lower portion is less than a width of the upper portion according to an aspect ratio. The contact plugs 180 may be disposed to recess the source/drain region 150 to a predetermined depth.

The contact plugs 180 may include a metal-semiconductor compound layer 182 disposed on a lower side, a barrier layer 184 disposed along sidewalls, and a plug conductive layer 186. For example, the metal-semiconductor compound layer 182 may be a metal silicide layer. For example, the barrier layer 184 may include a metal nitride, e.g., titanium nitride (TiN), tantalum nitride (TaN), or tungsten nitride (WN). For example, the plug conductive layer 186 may include a metal material, e.g., aluminum (Al), tungsten (W), or molybdenum (Mo). In example embodiments, the contact plug 180 may be disposed to pass through at least a portion of the source/drain region 150. In example embodiments, the number and arrangement of conductive layers constituting the contact plugs 180 may be variously changed. In addition, an interconnection structure, e.g., a contact plug, may be also further disposed on the gate electrode 165, and an interconnection structure connected to the contact plugs 180 may be further disposed on the contact plugs 180.

In the description of the following embodiments, descriptions overlapping those described above with reference to FIGS. 1 and 2A will be omitted.

Figure 2B:
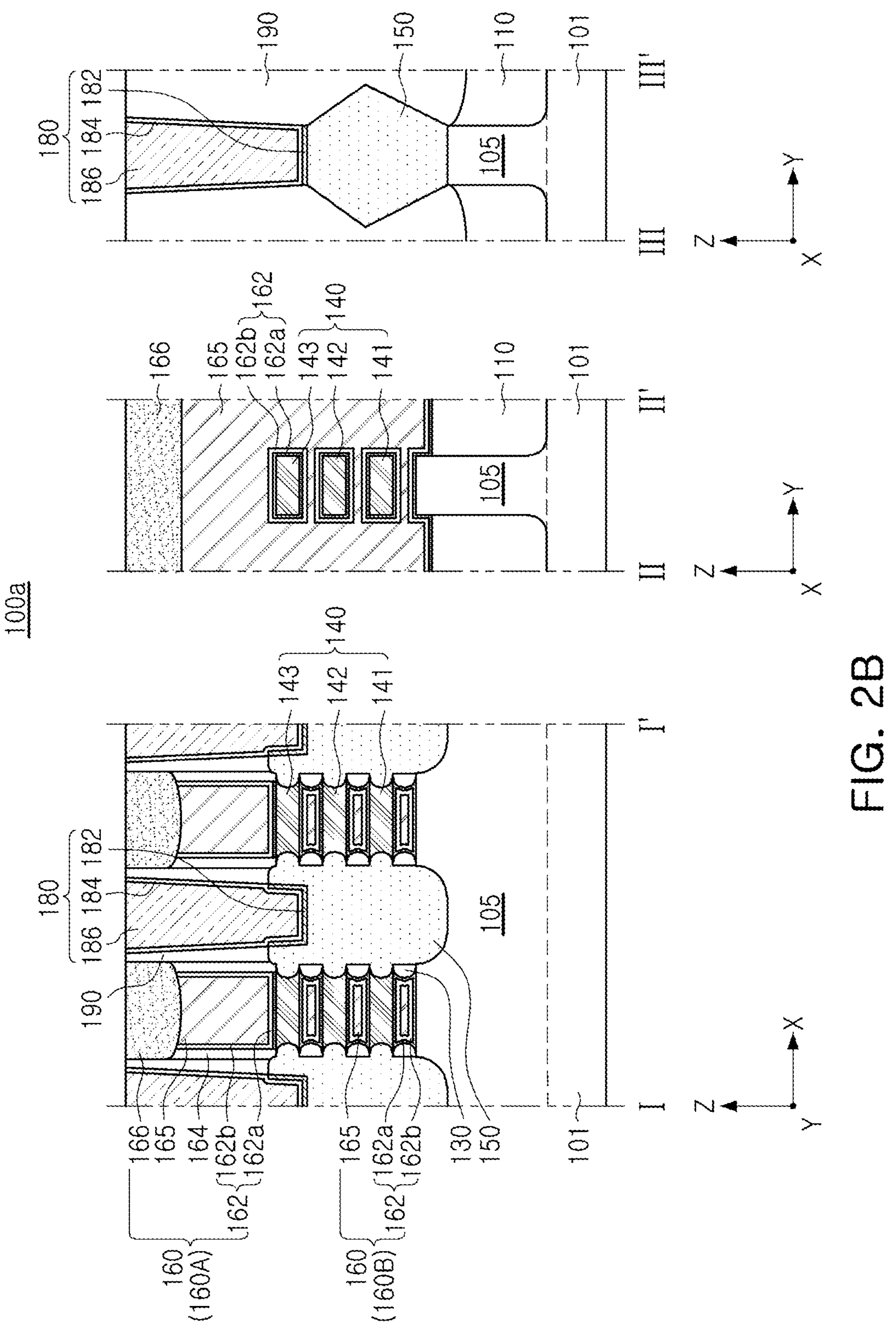
FIG. 2B is a cross-sectional view illustrating a semiconductor device according to example embodiments.
Figure 2C:
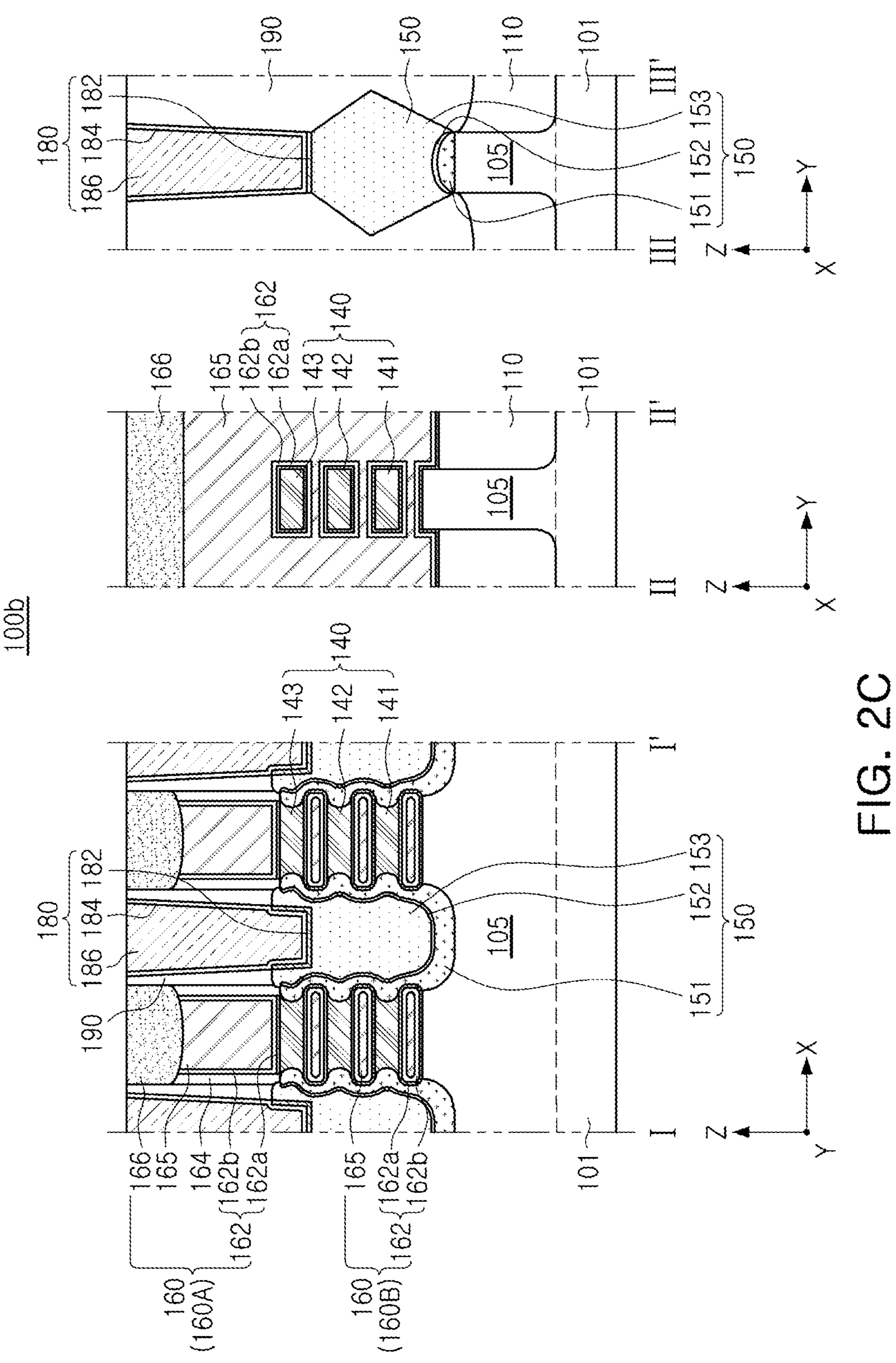
FIG. 2C is a cross-sectional view illustrating a semiconductor device according to example embodiments.
Figure 2D:
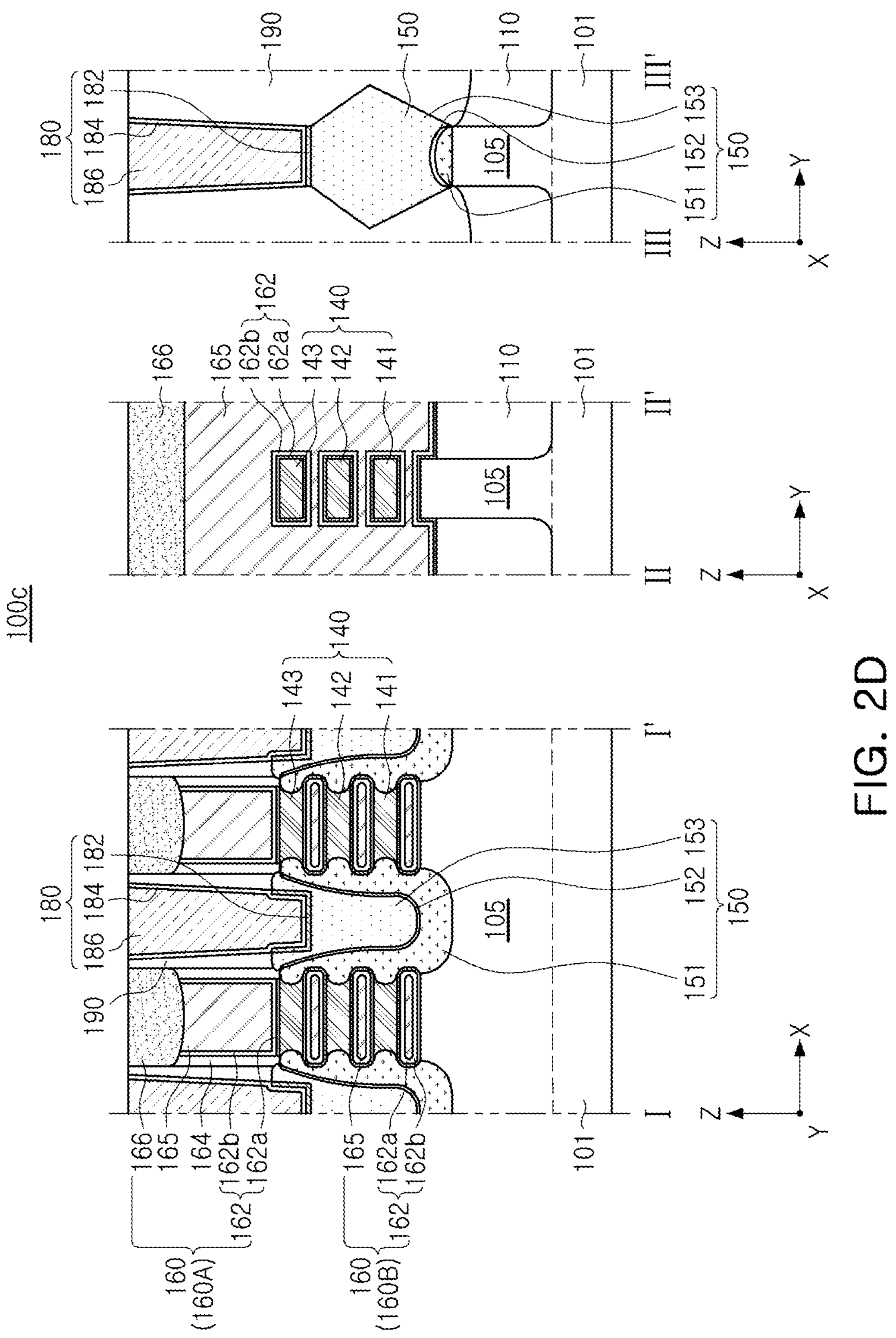
FIG. 2D is a cross-sectional view illustrating a semiconductor device according to example embodiments.

FIG. 2B is a cross-sectional view illustrating a semiconductor device 100*a according to example embodiments.*

Referring to FIG. 2B, the semiconductor device 100*a* may further include internal spacer layers 130 disposed on both, e.g., opposite, sides of, e.g., each of, the lower portions 160B of the gate structure 160 in the first direction (X-direction) on a lower surface of each of the first to third channel layers 141, 142, and 143. The internal spacer layers 130 may be disposed to be parallel to the gate electrode 165 between the first to third channel layers 141, 142, and 143. The internal spacer layers 130 may contact the first gate dielectric layer 162*a*. Side surfaces of the internal spacer layers 130 may contact the source/drain region 150. The gate electrode 165 may be spaced apart from the source/drain region 150 by the internal spacer layers 130, below each of the first to third channel layers 141, 142, and 143, and electrically separated from each other. The internal spacer layers 130 may have a shape in which side surfaces facing the gate electrode 165 are convexly rounded inwardly toward the gate electrode 165. The internal spacer layers 130 may be formed of, e.g., an oxide, a nitride, an oxynitride, and/or a low-κ film.

For example, the internal spacer layers 130 may be formed of the same material as the gate spacer layers 164. For example, the internal spacer layers 130 may include at least one of SiN, SiCN, SiOCN, SiBCN, and SiBN. The internal spacer layers 130 may be also applied in other example embodiments.

According to an example embodiment, in a region in which the gate structure 160 and the first to third channel layers 141, 142, and 143 vertically overlap each other, a minimum width between surfaces at which at least one of the first to third channel layers 141, 142, and 143 and the source/drain regions 150 contact each other in the first direction (X-direction) may be less than a width between surfaces at which the source/drain region 150 and the internal spacer layers 130 contact each other in the first direction (X-direction).

FIG. 2C is a cross-sectional view illustrating a semiconductor device 100*b* according to example embodiments.

Referring to FIG. 2C, the source/drain region 150 may include a first epitaxial layer 151, a second epitaxial layer 152, and a third epitaxial layer 153. The first epitaxial layer 151 may be disposed, e.g., directly, on the active region 105, and may extend to, e.g., directly, contact the first to third channel layers 141, 142, and 143. The second epitaxial layer 152 may be disposed on the first epitaxial layer 151, and may be thinner than the first epitaxial layer 151. The third epitaxial layer 153 may be disposed on the second epitaxial layer 152. The second epitaxial layer 152 may be conformal on the first epitaxial layer 151. For example, the second epitaxial layer 152 may have side surfaces concave inwardly and outwardly relative to the first epitaxial layer 151 along an outer side surface of the first epitaxial layer 151.

According to an example embodiment, a first distance from a side surface of each of the first to third channel layers 141, 142, and 143 to an outer side surface of the third epitaxial layer 153 in the first direction (X-direction), on a center level of each of the first to third channel layers 141, 142, and 143 may not be less than a second distance from the outer side surface of the first epitaxial layer 151 to the outer side surface of the third epitaxial layer 153 in the first direction (X-direction), on a center level of each of the lower portions 160B of the gate structure 160.

FIG. 2D is a cross-sectional view illustrating a semiconductor device 100*c* according to example embodiments. Contents overlapping with those described above with reference to FIG. 2C are omitted.

Referring to FIG. 2D, a surface at which the first epitaxial layer 151 and the second epitaxial layer 152 contact each other may have a gentle U-shape rather than a wavy shape. In addition, a surface at which the second epitaxial layer 152 and the third epitaxial layer 153 contact each other may have a gentle U shape.

Figure 3A:
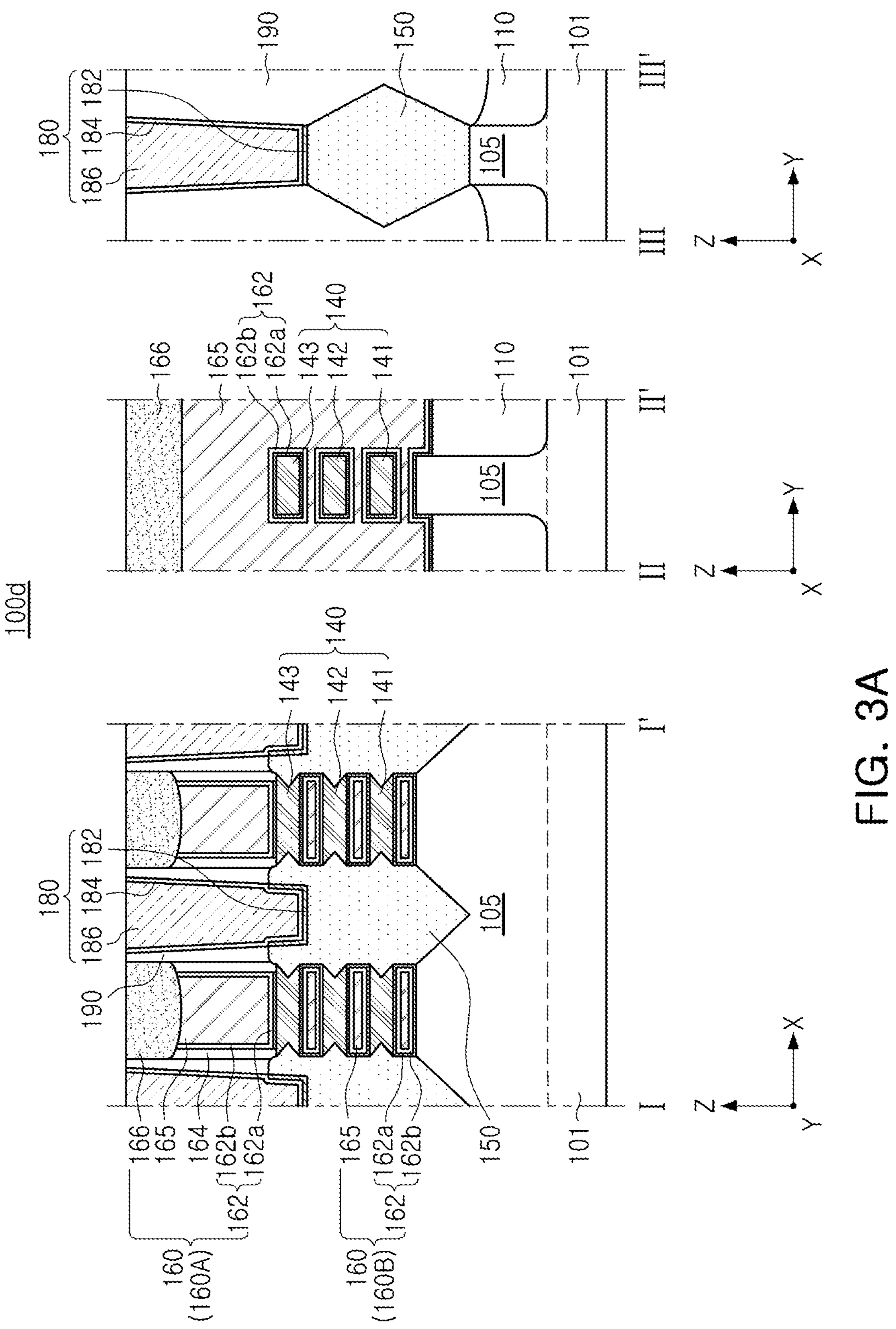
FIG. 3A is a cross-sectional view illustrating a semiconductor device according to example embodiments.

FIG. 3A is a cross-sectional view illustrating a semiconductor device 100*d* according to example embodiments.

Referring to FIG. 3A, unlike the example embodiment of FIG. 2A, at least a portion of surfaces at which the source/drain regions 150 and the first to third channel layers 141, 142, and 143 contact each other have a (111) crystal orientation. Therefore, outer side surfaces of the source/drain regions 150 may have a sharp sigma shape toward a central portion of the first to third channel layers 141, 142, and 143. For example, as illustrated in FIG. 3A, portions of outer side surfaces of the source/drain regions 150 facing each of the first to third channel layers 141, 142, and 143 may have a sharp sigma shape, e.g., a triangular shape pointing toward a corresponding one of the first to third channel layers 141, 142, and 143. Similarly, at least a portion of surfaces at which the source/drain regions 150 and the active region 105 contact each other may have a (111) crystal orientation, e.g., so surfaces at which the source/drain regions 150 and the active region 105 contact each other may have a sharp shape.

Figure 3B:
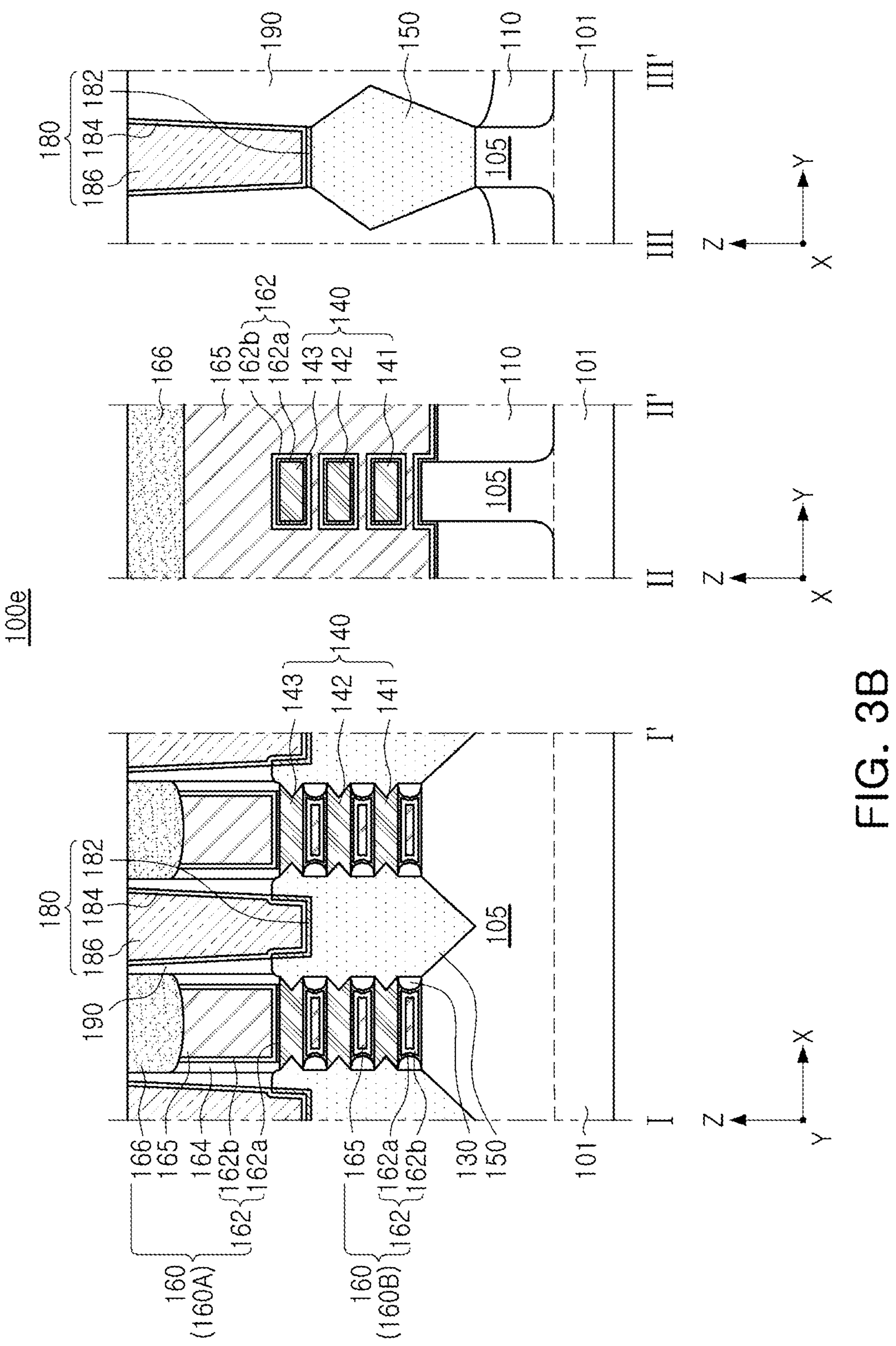
FIG. 3B is a cross-sectional view illustrating a semiconductor device according to example embodiments.

FIG. 3B is a cross-sectional view illustrating a semiconductor device 100*e* according to example embodiments. Contents overlapping with the above description with reference to FIG. 3A and FIG. 2B will be omitted.

Referring to FIG. 3B, the internal spacer layers 130 disposed on both sides of the lower portion 160B of the gate structure 160 in the first direction (X-direction) on the lower surface of each of the first to third channel layers 141, 142, and 143 may be further included. For example, as illustrated in FIG. 3B, the internal spacer layers 130 may vertically alternate with the sigma shapes of the source/drain regions 150.

Figure 3C:
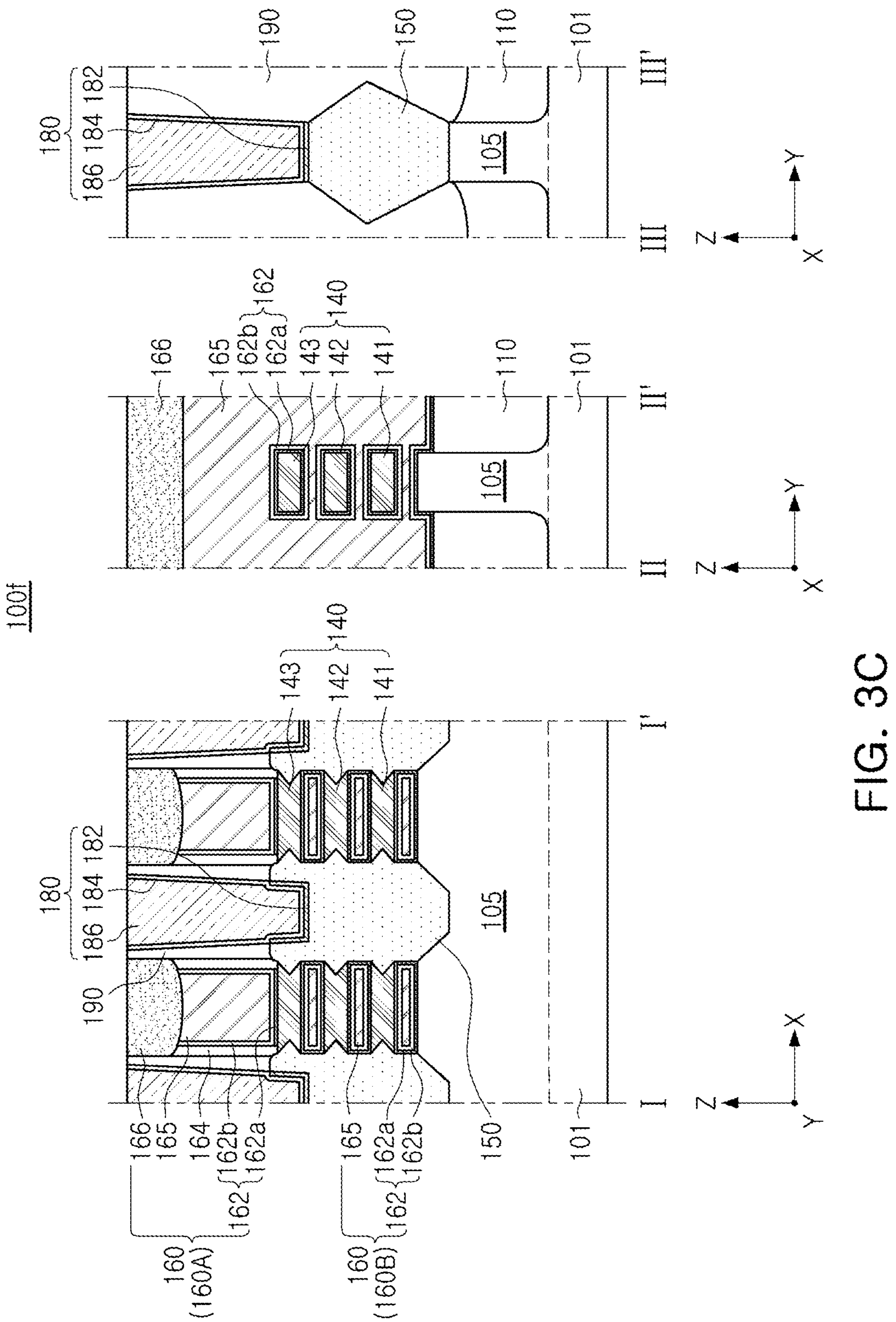
FIG. 3C is a cross-sectional view illustrating a semiconductor device according to example embodiments.

FIG. 3C is a cross-sectional view illustrating a semiconductor device 100*f* according to example embodiments. Contents overlapping with the above description with reference to FIG. 3A will be omitted.

Referring to FIG. 3C, at least a portion of surfaces at which the source/drain regions 150 and the active region 105 contact each other may be parallel to an upper surface of the substrate 101. For example, a portion of the surfaces at which the source/drain regions 150 and the active region 105 contact each other, e.g., in a portion vertically overlapping the bottom of the contact plug 180, may be flat.

Figure 3D:
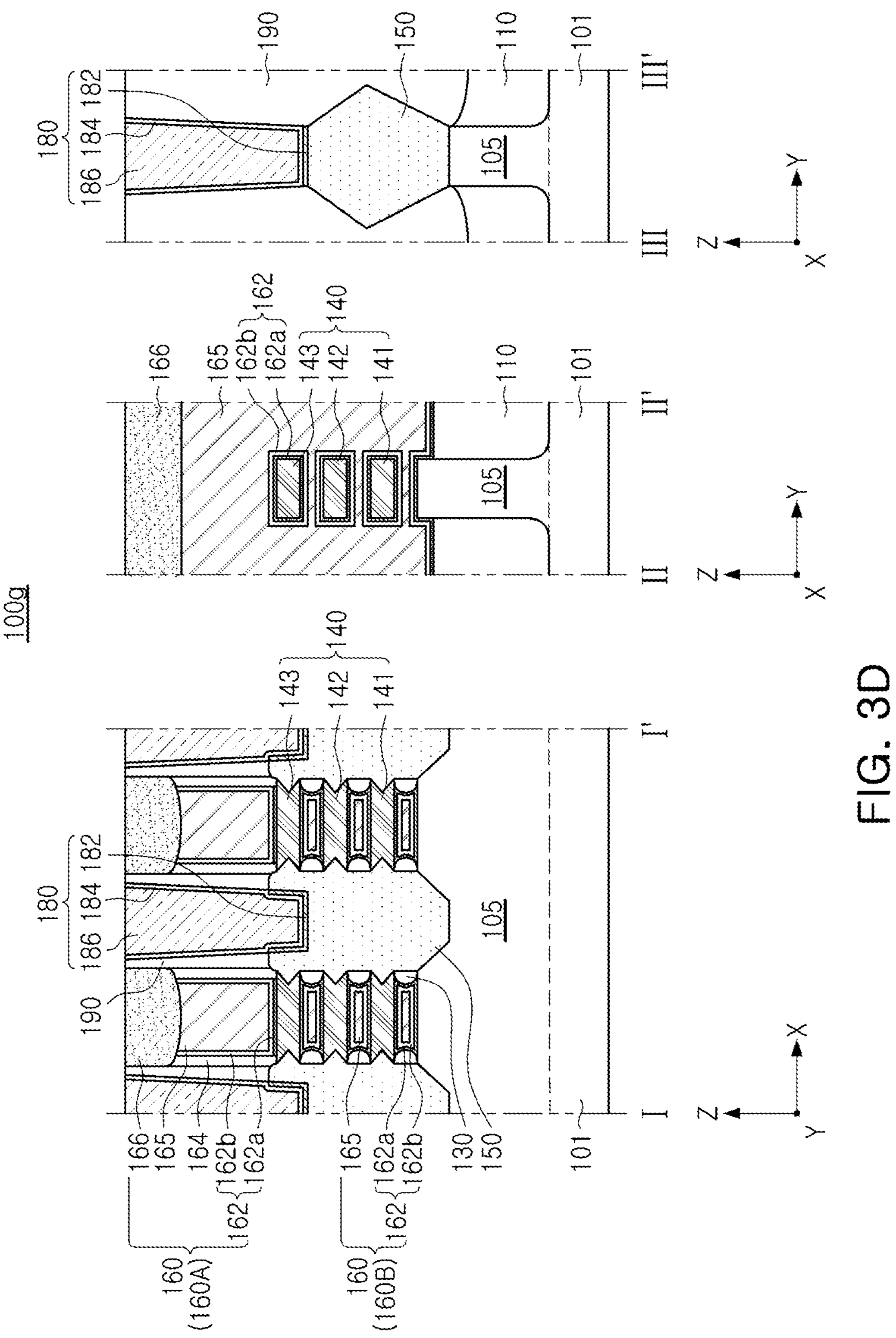
FIG. 3D is a cross-sectional view illustrating a semiconductor device according to example embodiments.

FIG. 3D is a cross-sectional view illustrating a semiconductor device 100*g* according to example embodiments. Contents overlapping with the above description with reference to FIG. 3C and FIG. 2B will be omitted.

Referring to FIG. 3D, the internal spacer layers 130 may be disposed on both sides of the lower portion 160B of the gate structure 160 in the first direction (X-direction) on a lower surface of each of the first to third channel layers 141, 142, and 143.

Figure 4A:
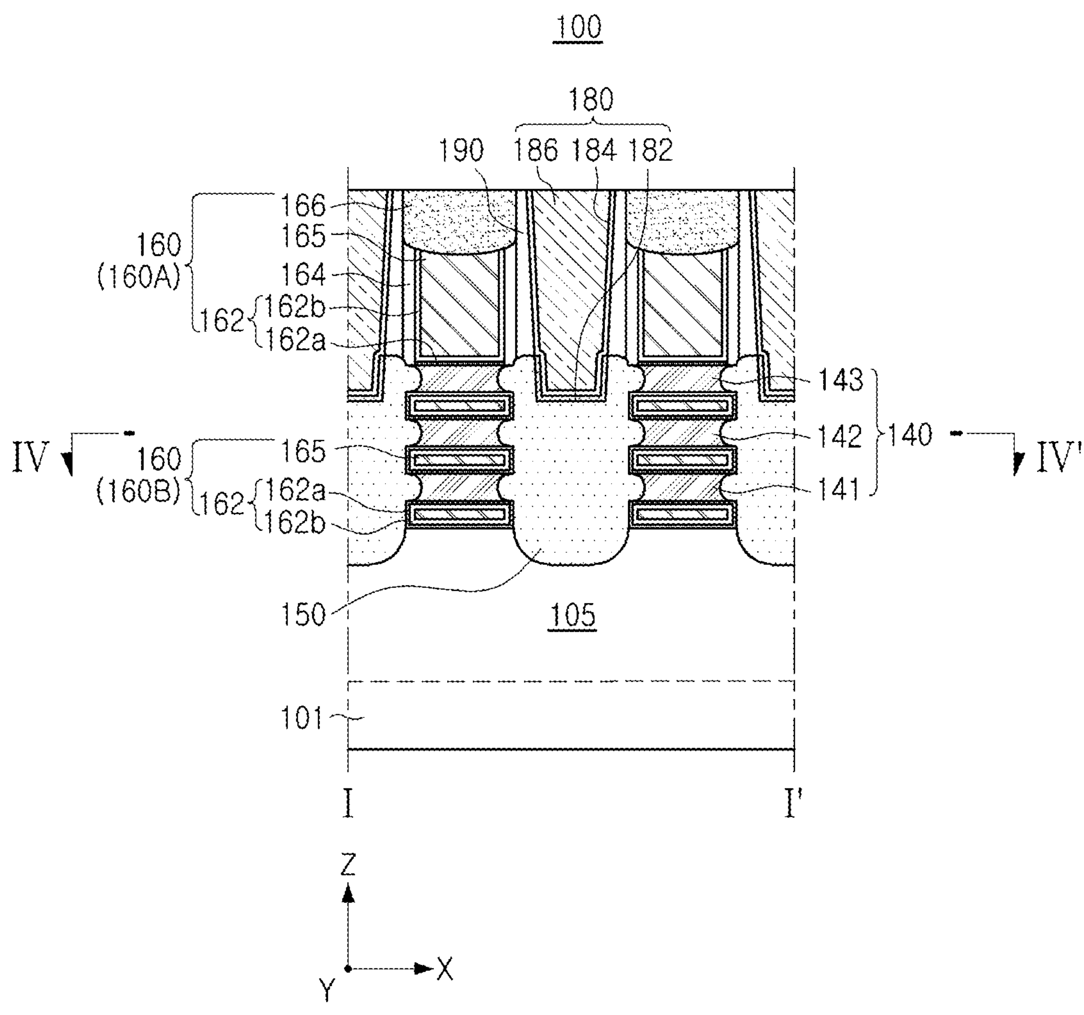
FIG. 4A is a cross-sectional view illustrating a semiconductor device according to example embodiments.
Figure 4B:
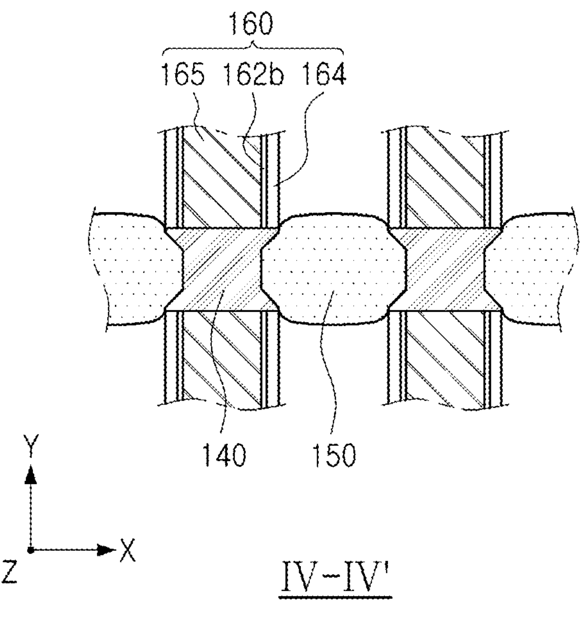
FIG. 4B is a horizontal cross-sectional view illustrating a semiconductor device according to example embodiments.
Figure 4C:
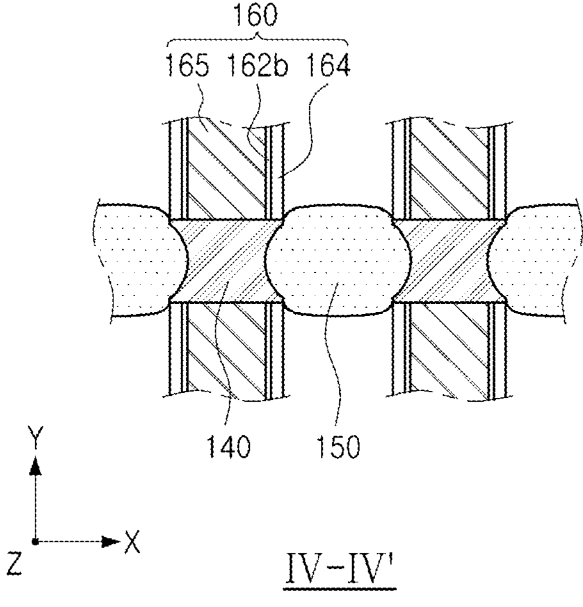
FIG. 4C is a horizontal cross-sectional view illustrating a semiconductor device according to example embodiments.
Figure 4D:
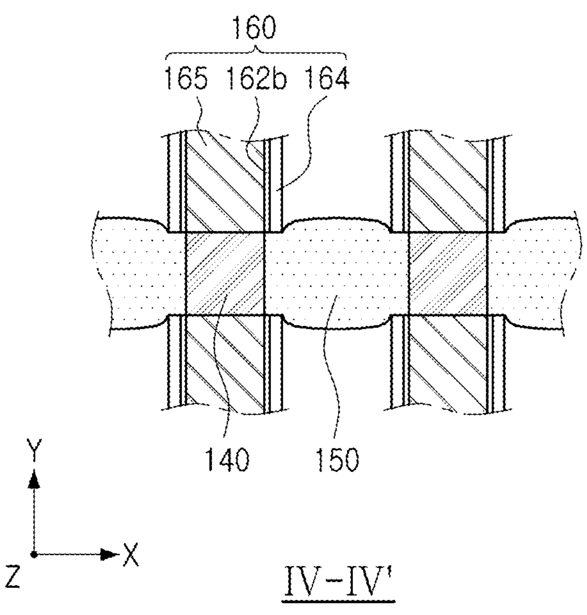
FIG. 4D is a horizontal cross-sectional view illustrating a semiconductor device according to example embodiments.

FIG. 4A is a cross-sectional view illustrating a semiconductor device according to example embodiments. FIGS. 4B to 4D are horizontal cross-sectional views along line IV-IV' of FIG. 4A, according to example embodiments.

Referring to FIGS. 4A to 4D, a surface at which the source/drain region 150 and the first to third channel layers 141, 142, and 143 contact each other may have various shapes according to a crystal orientation of an upper surface of the substrate 101 and the first to third channel layers 141, 142 and 143.

As illustrated in FIG. 4B, when the upper surface of the substrate 101 has a (110) crystal orientation and the first to third channel layers 141, 142, and 143 have a (100) crystal orientation, at least a portion of the surfaces at which the source/drain regions 150 and the first to third channel layers 141, 142, and 143 contact each other may have a (111) crystal orientation toward the first to third channel layers 141, 142, and 143. Another portion of the surfaces at which the source/drain regions 150 and the first to third channel layers 141, 142, and 143 contact each other may have a (110) crystal orientation parallel to the second direction (Y-direction).

As illustrated in FIG. 4C, at least a portion of the surfaces at which the source/drain regions 150 and the first to third channel layers 141, 142, and 143 contact each other may have a rounded shape. IN this case, for example, the source/drain region 150 may have an elliptical shape, e.g., in a top view.

Figure 5A:
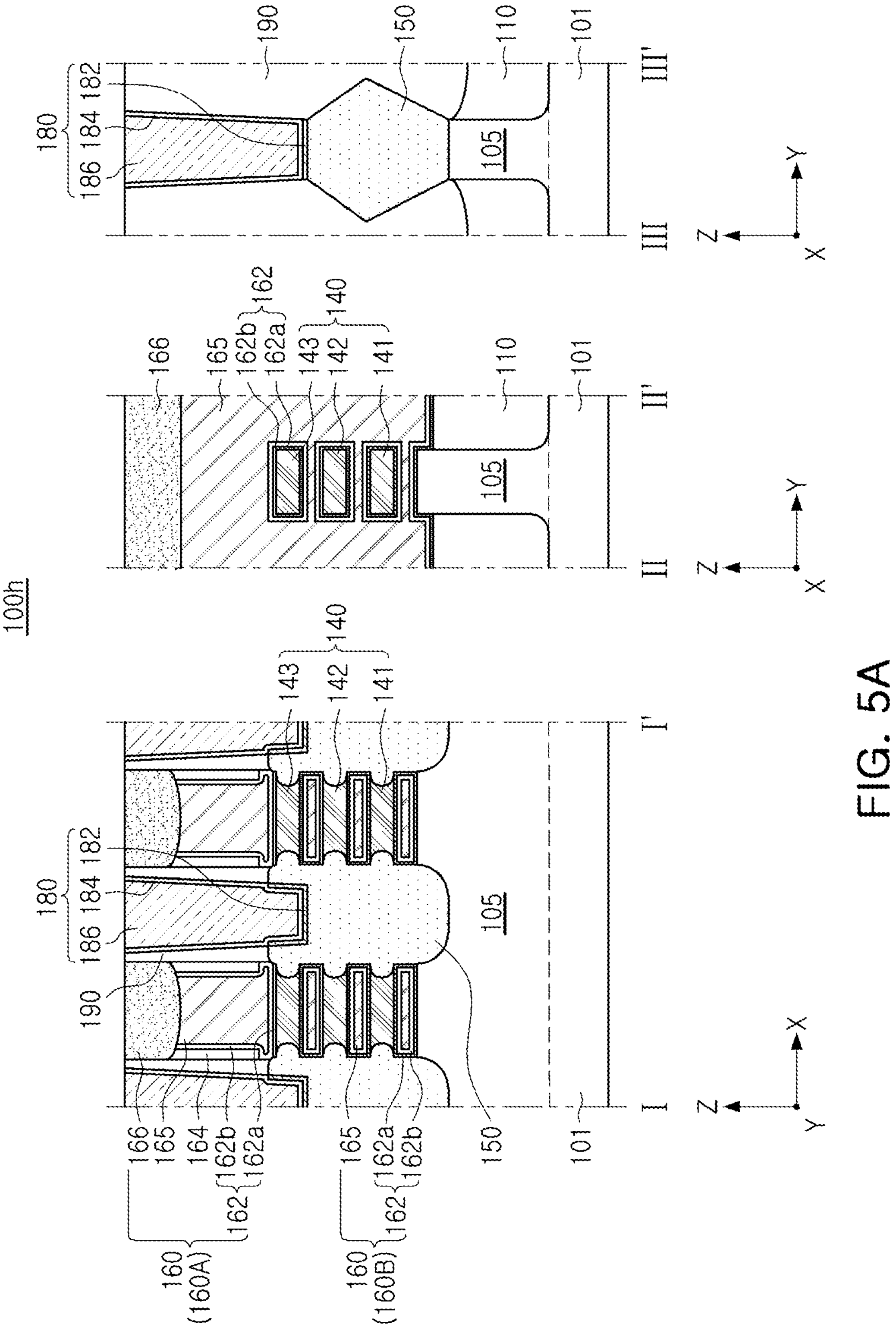
FIG. 5A is a cross-sectional view illustrating a semiconductor device according to example embodiments.

As illustrated in FIG. 4D, when the upper surface of the substrate 101 has a (110) crystal orientation and the first to third channel layers 141, 142, and 143 have a (111) crystal orientation, at least a portion of the surfaces at which the source/drain regions 150 and the first to third channel layers 141, 142, and 143 contact each other may have a (111) crystal orientation, parallel to the second direction (Y-direction). FIG. 5A is a cross-sectional view illustrating a semiconductor device 100*h* according to example embodiments.

Referring to FIG. 5A, unlike the example embodiment of FIG. 2A, in the upper portion 160A of the gate structure 160, the first and second gate dielectric layers 162*a* and 162*b* may contact at least one of the interlayer insulating layer 190 and the source/drain regions 150. That is, in a region in which the gate structure 160 and the first to third channel layers 141, 142, and 143 vertically overlap, the second gate dielectric layer 162*b*, above the uppermost channel layer among the first to third channel layers 141, 142, and 143 may be in contact with at least one of the interlayer insulating layer 190 and the source/drain regions 150. When an upper surface of the source/drain region 150 is formed to be low, the gate spacer layers 164 may be spaced apart from the source/drain region 150.

Figure 5B:
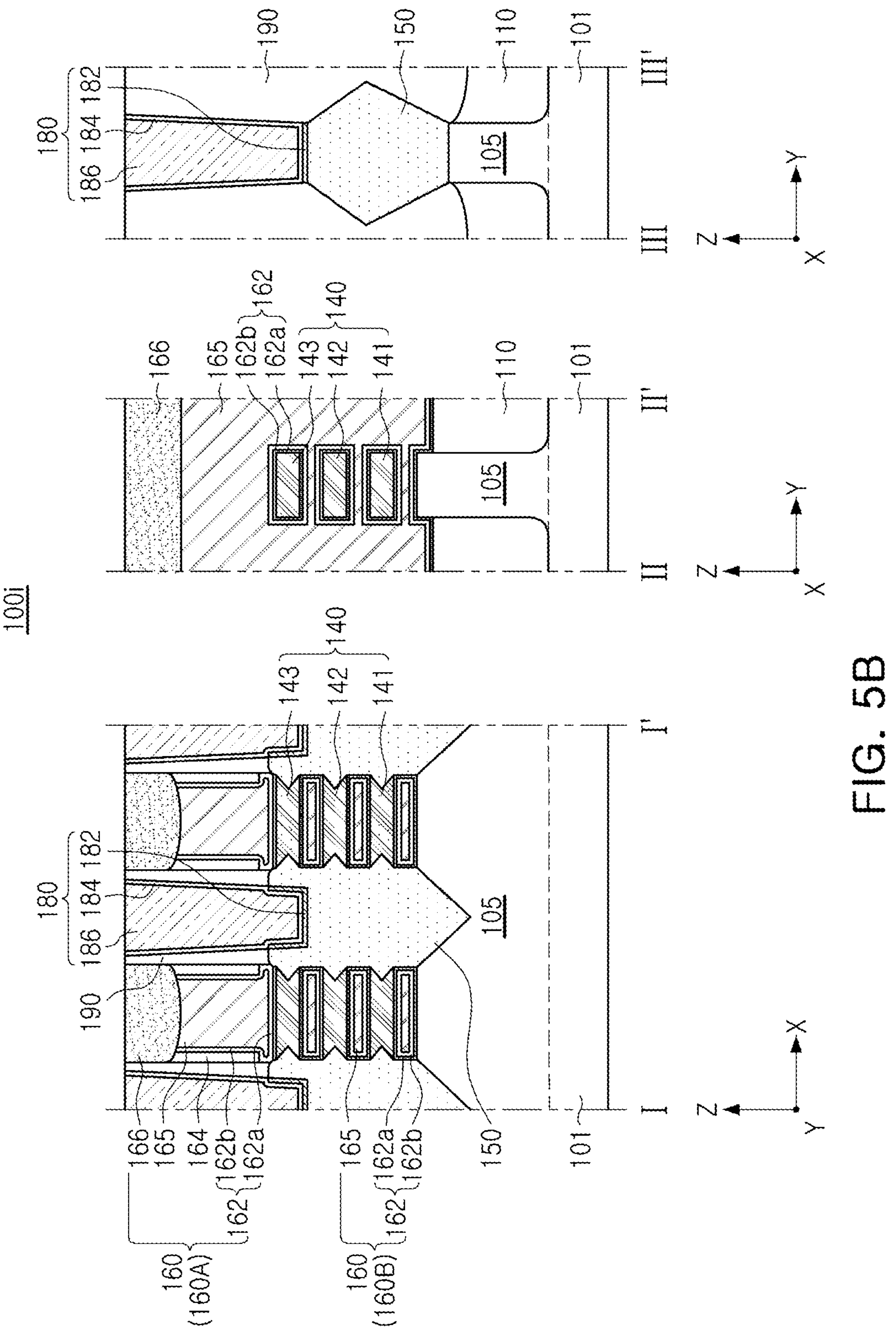
FIG. 5B is a cross-sectional view illustrating a semiconductor device according to example embodiments.

FIG. 5B is a cross-sectional view illustrating a semiconductor device 100*i* according to example embodiments. Content overlapping with the above description with reference to FIG. 5A will be omitted.

Referring to FIG. 5B, unlike the example embodiment of FIG. 5A, at least a portion of surfaces in which the source/drain regions 150 and the first to third channel layers 141, 142, and 143 contact each other may have a (111) crystal orientation. Accordingly, the outer surfaces of the source/drain regions 150 may have a sharp sigma shape toward a central portion of the first to third channel layers 141, 142, and 143. At least a portion of surfaces at which the source/drain regions 150 and the active region 105 contact each other may have a (111) crystal orientation.

FIGS. 6A to 6G are cross-sectional views illustrating stages in a manufacturing method of the semiconductor device 100 according to example embodiments. FIGS. 6A to 6G correspond to the cross-sections of FIG. 2A.

Figure 6A:
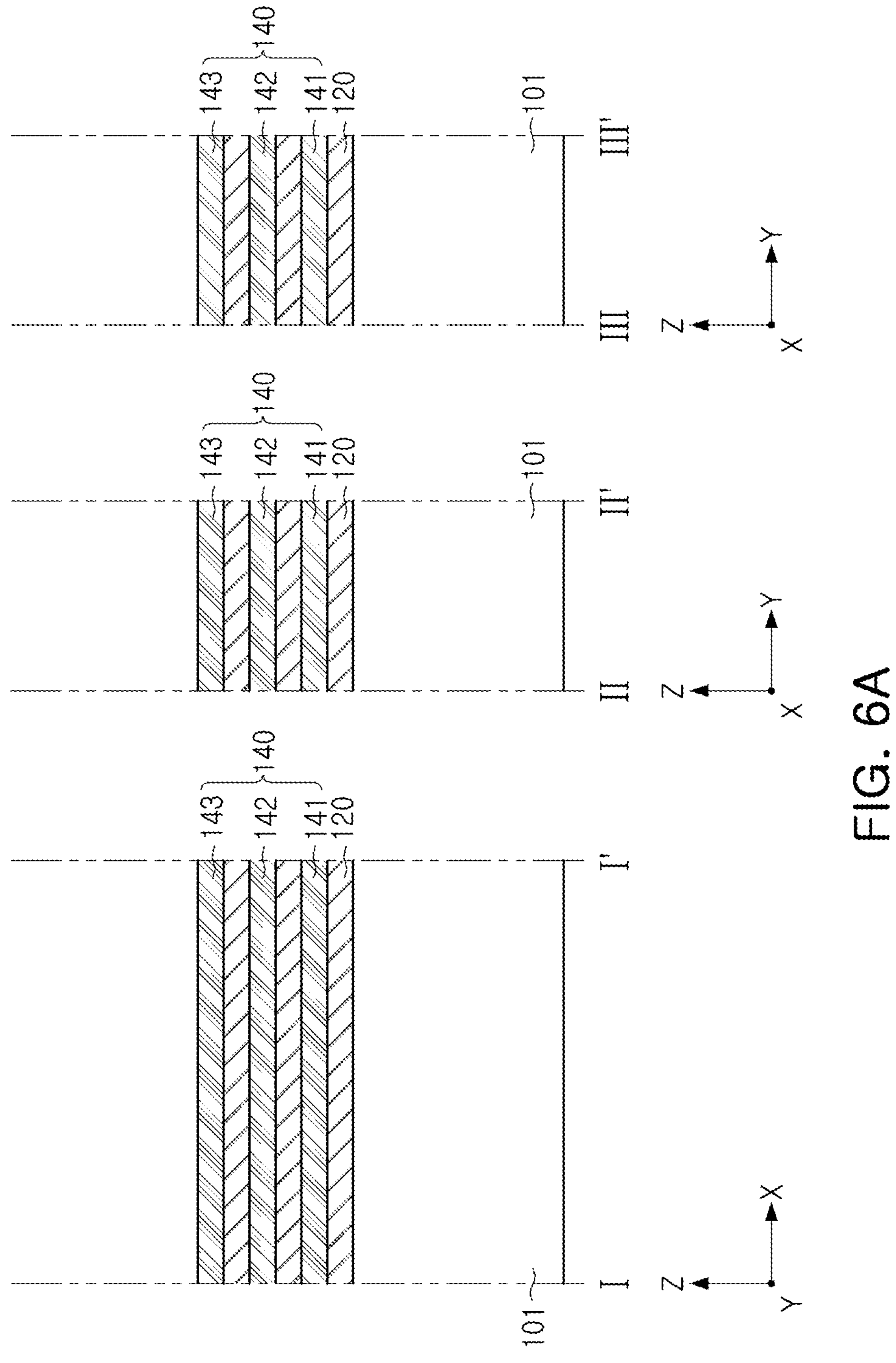
FIGS. 6A, 6B, 6C, 6D, 6E, 6F and 6G are cross-sectional views illustrating stages in a manufacturing method of a semiconductor device according to example embodiments.

Referring to FIG. 6A, sacrificial layers 120 and a plurality of channel layers, first to third channel layers 141, 142, and 143, may be alternately stacked on the active region 105.

The sacrificial layers 120 may be layers, replaced with the first and second gate dielectric layers 162*a* and 162*b* and the gate electrode 165, as illustrated in FIG. 2A, through a subsequent process. Each of the sacrificial layers 120 may be formed of a material having etch selectivity with respect to the first to third channel layers 141, 142, and 143. Each of the first to third channel layers 141, 142, and 143 may include a material different from that of the sacrificial layers 120. In an example embodiment, each of the first to third channel layers 141, 142, and 143 may include silicon (Si), and the sacrificial layers 120 may include silicon germanium (SiGe).

The sacrificial layers 120 and the first to third channel layers 141, 142, and 143 may be formed by performing an epitaxial growth process using the substrate 101 as a seed. Each of the sacrificial layers 120 and the first to third channel layers 141, 142, and 143 may have a thickness in a range of about 1 angstrom to about 100 nm. The number of layers of the channel layers, e.g., first to third channel layers

141, 142, and 143, alternately stacked with the sacrificial layers 120 may be variously changed in example embodiments.

Figure 6B:
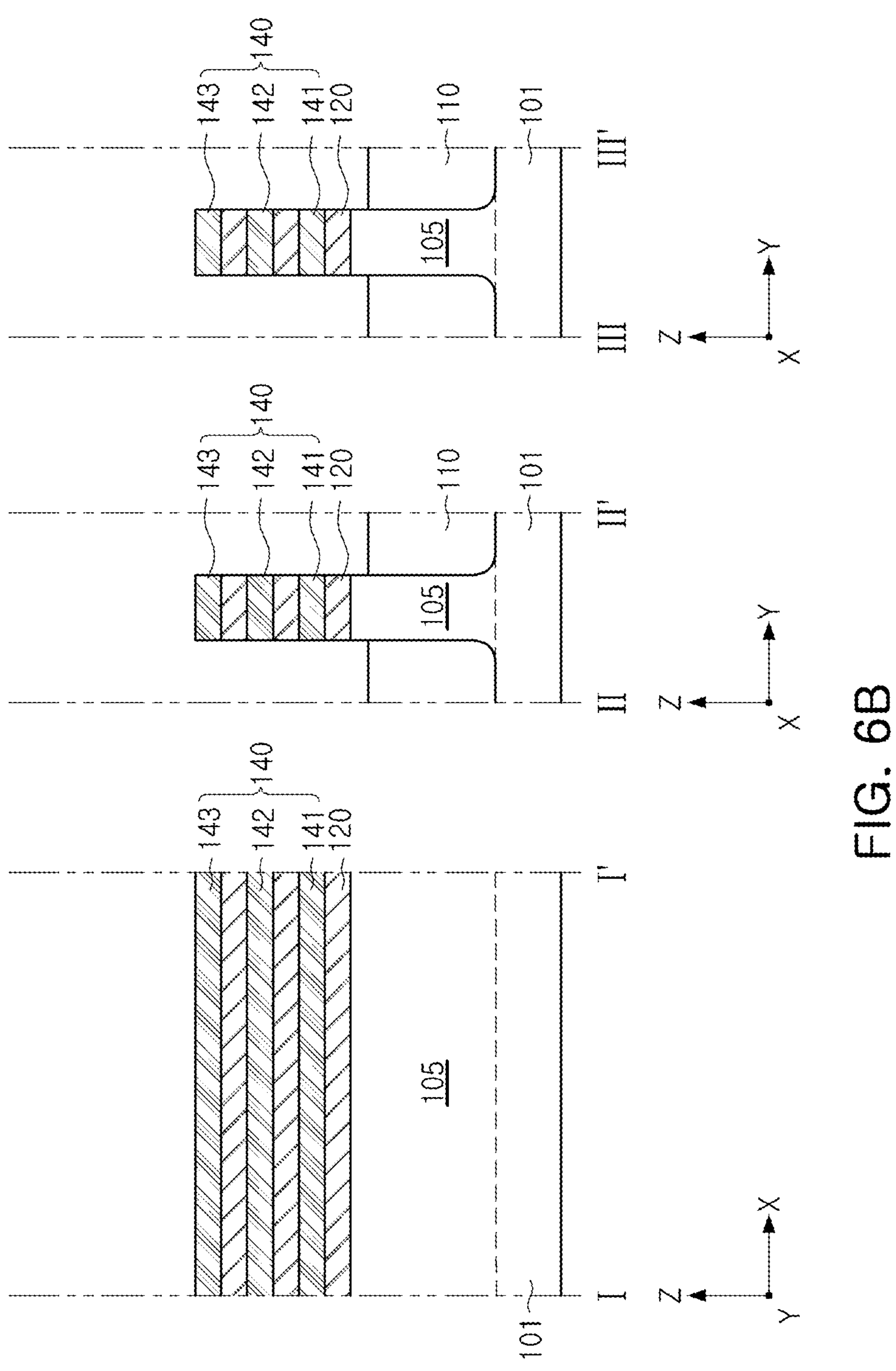

Referring to FIG. 6B, active structures may be formed by removing portions of the stack structure of the sacrificial layers 120 and the first to third channel layers 141, 142, and 143 as well as the substrate 101. The active structure may include the sacrificial layers 120 and the first to third channel layers 141, 142, and 143, alternately stacked with each other, and the active region 105 formed to protrude an upper surface of the substrate 101 by removing a portion of the substrate 101. The active structures may be formed in a line shape extending in one direction, e.g., the X-direction, and may be spaced apart from each other in the Y-direction. Depending on an aspect ratio, the active region 105 may have an inclined shape so that a width thereof increases while facing downwardly.

The device isolation layers 110 may be formed in a region from which a portion of the substrate 101 is removed by filling an insulating material and then recessing the same so that the active region 105 protrudes. Upper surfaces of the device isolation layers 110 may be formed lower than an upper surface of the active region 105.

Figure 6C:
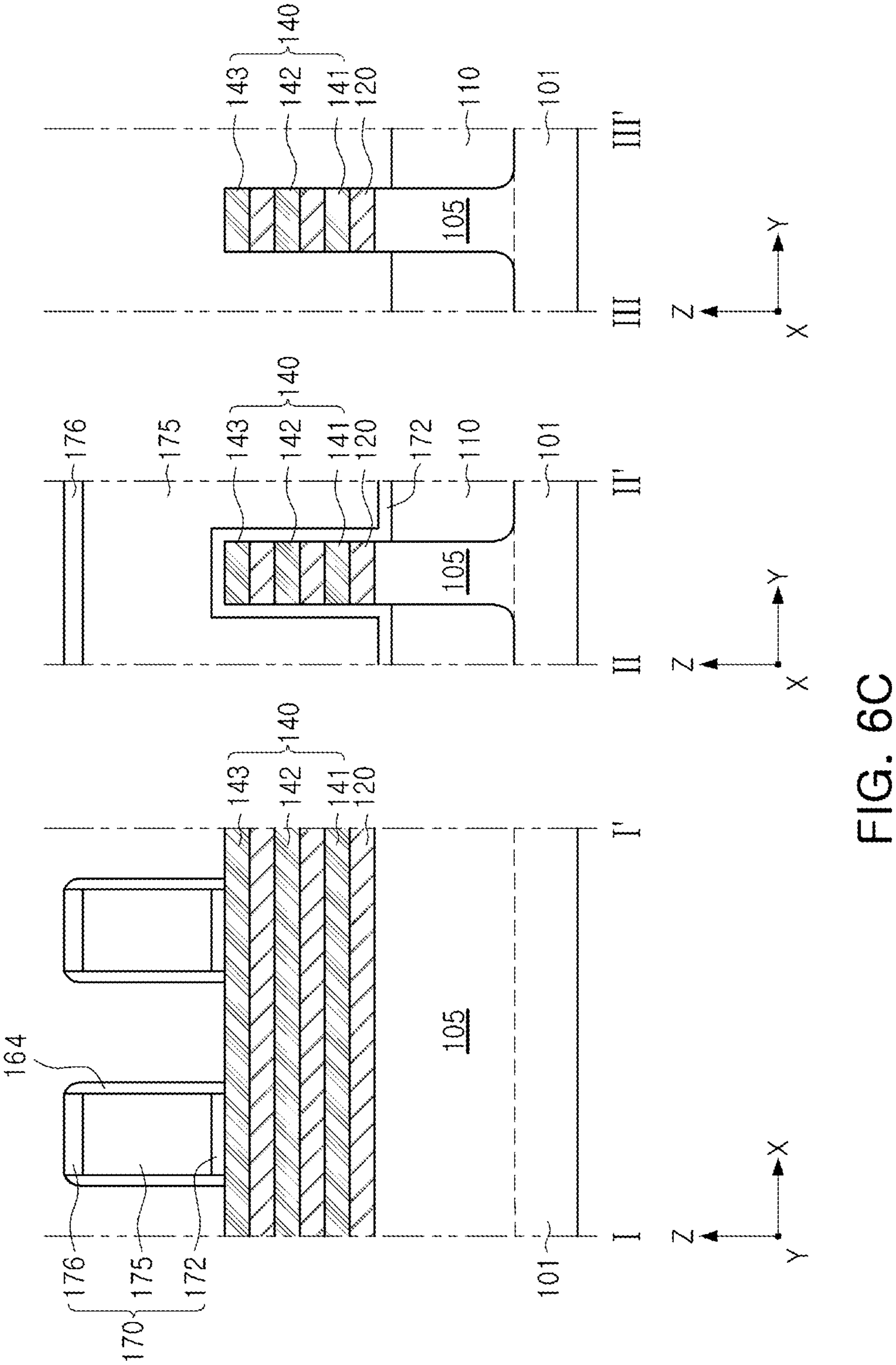

Referring to FIG. 6C, sacrificial gate structures 170 and the gate spacer layers 164 may be formed on the active structures. The sacrificial gate structures 170 may be sacrificial structures formed in a region in which the first and second gate dielectric layers 162*a* and 162*b* and the gate electrode 165 are to be disposed above the first to third channel layers 141, 142, and 143.

The sacrificial gate structures 170 may include first and second sacrificial gate layers 172 and 175 and a mask pattern layer 176, sequentially stacked. The first and second sacrificial gate layers 172 and 175 may be patterned using the mask pattern layer 176. The first and second sacrificial gate layers 172 and 175 may be an insulating layer and a conductive layer, respectively. For example, the first sacrificial gate layer 172 may include a silicon oxide, and the second sacrificial gate layer 175 may include polysilicon. The mask pattern layer 176 may include, e.g., a silicon nitride. The sacrificial gate structures 170 may have a line shape extending in one direction crossing the active structures.

The sacrificial gate structures 170 may extend in the Y-direction and be spaced apart from each other in the X-direction. The gate spacer layers 164 may be formed on both sidewalls of the sacrificial gate structures 170. The gate spacer layers 164 may be formed by forming a film having a uniform thickness along upper and side surfaces of the sacrificial gate structures 170 and the active structures, and then anisotropically etching the same. The gate spacer layers 164 may be made of a low-κ material, and may include, e.g., at least one of SiO, SiN, SiCN, SiOC, SiON, and SiOCN.

Figure 6D:
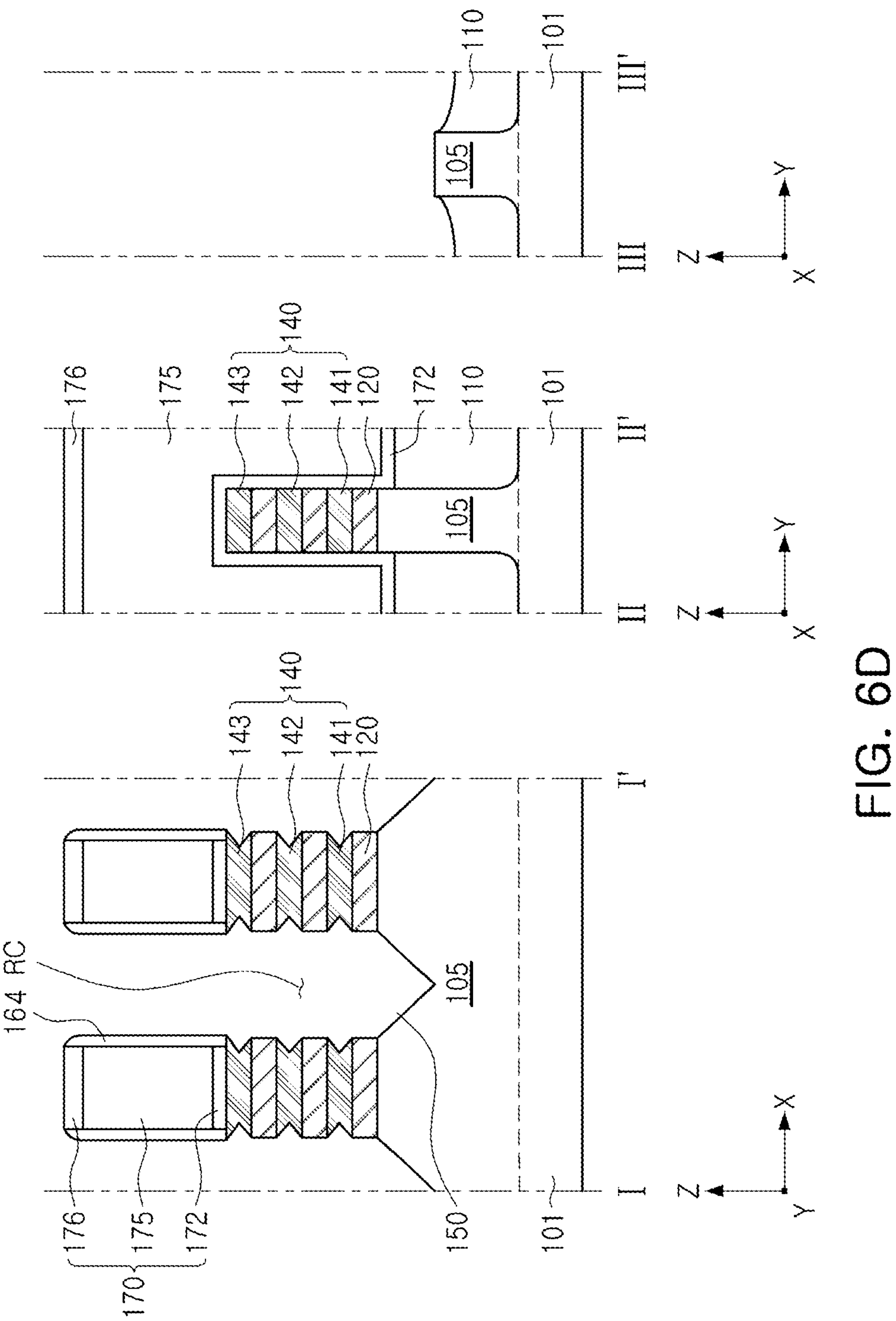

Referring to FIG. 6D, portions of exposed sacrificial layers and the first to third channel layers 141, 142, and 143 may be partially removed between the sacrificial gate structures 170 to form a recess region RC. In the process, the active region 105 may be partially removed.

In detail, a portion of the exposed sacrificial layers 120 and the first to third channel layers 141, 142, and 143 may be removed using the sacrificial gate structures 170 and the gate spacer layers 164 as a mask to form the recess region RC. The recess process may be formed by, e.g., sequentially applying a dry etching process and a wet etching process. First, the recess region RC may be formed in a vertical direction through a dry etching process. Next, the recess region RC may be formed in a horizontal direction through a wet etching process. Accordingly, the first to third channel layers 141, 142, and 143 may have a limited length in the X-direction.

Etching the first to third channel layers 141, 142, and 143 and the active region 105 may include crystallographic anisotropic etching. For crystallographic anisotropic etching by wet etching, e.g., KOH, NaOH, $NH_4OH$, TetraMethyl-Ammonium Hydroxide (TMAH), or the like, may be used as an etchant. When crystallographic anisotropic etching is used, the first to third channel layers 141, 142, and 143 may be etched at different etching rates according to the crystal orientation of the first to third channel layers 141, 142, and 143 and the substrate 101. As a result, at least a portion of the outer side surfaces of the first to third channel layers 141, 142, and 143 and the upper surface of the active region 105 may have a (111) crystal orientation, and the first to third channel layers 141, 142, and 143 may have a sharp sigma shape toward a central portion.

Figure 6E:
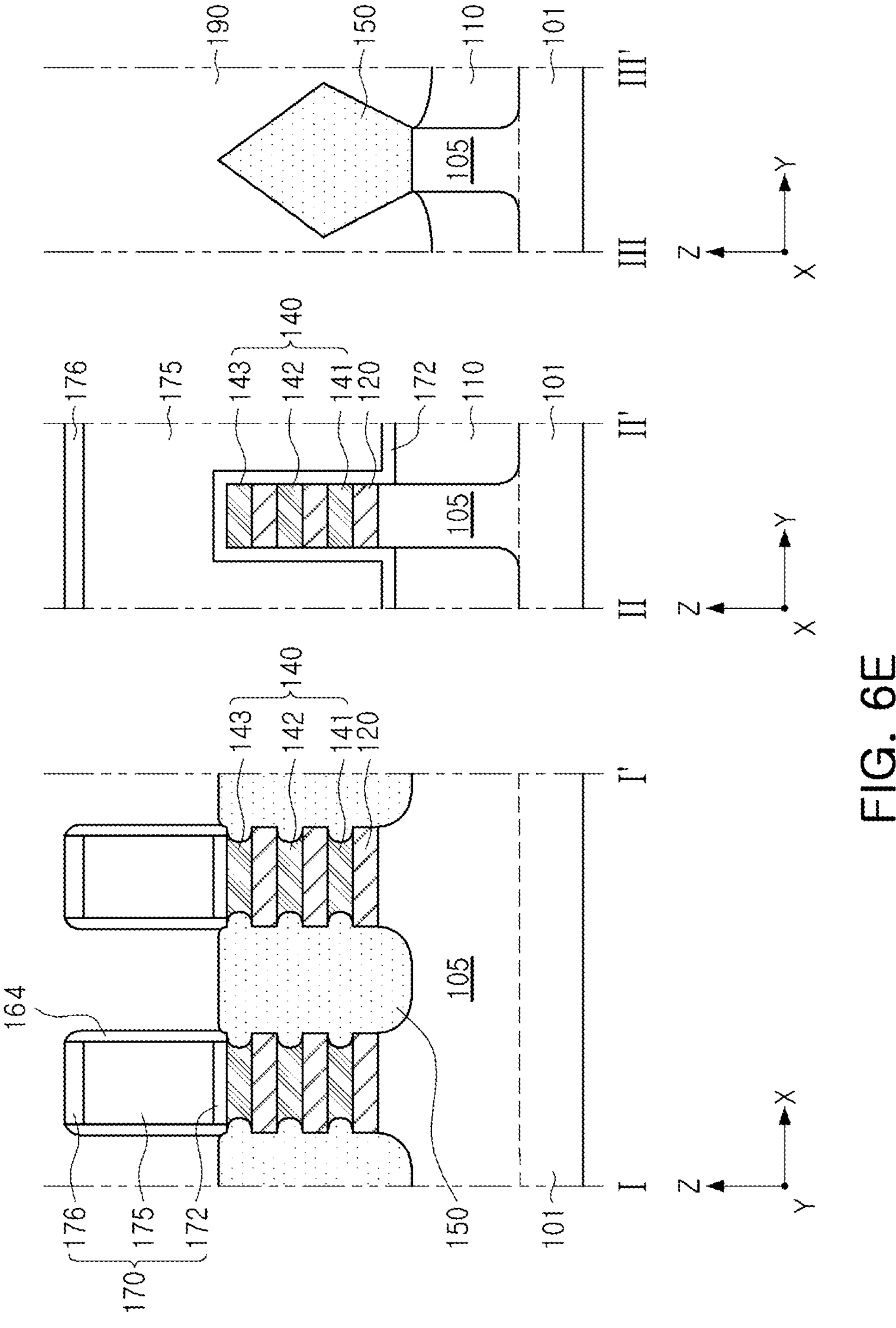

Referring to FIG. 6E, after a prebake process is performed, an epitaxial layer of the source/drain region 150 may be formed to fill the recess region RC.

First, a pre-bake process may be performed on the recess region RC to deform outer side surfaces of the recess region RC into a rounded shape. Since the pre-bake process may affect subsequent processes, it may be performed elaborately or may be omitted. For example, the semiconductor device as illustrated in FIGS. 3A to 3D may be manufactured after the pre-bake process.

Next, the source/drain regions 150 may be formed by an epitaxial growth process. The source/drain regions 150 may be formed by repeating epitaxial growth and etching processes, and may extend to contact the first to third channel layers 141, 142, and 143 and lower portions 160B of the gate structures 160. According to an example embodiment, a surface of the source/drain region 150 facing the first to third channel layers 141, 142, and 143 and the sacrificial layers 120 may have a wavy shape, e.g., side surfaces with protrusions as discussed with reference to FIG. 2A. The source/drain regions 150 may include impurities by in-situ doping. The upper surfaces of the source/drain regions 150 may be located on a level substantially the same as or higher than that of the lower surfaces of the upper portion 160A of the gate structures 160.

Figure 6F:
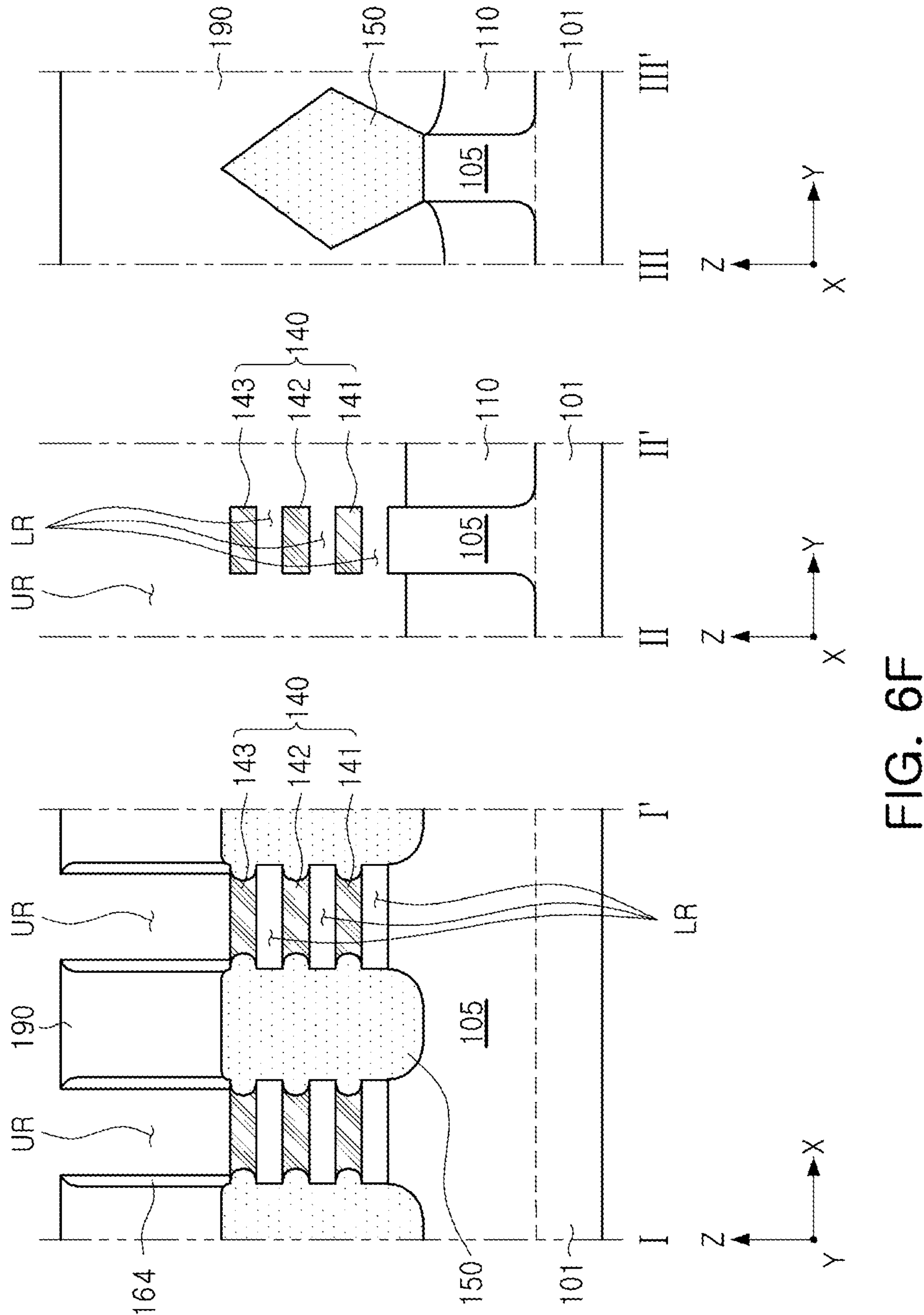

Referring to FIG. 6F, the interlayer insulating layer 190 may be formed, and the sacrificial layers 120 and the sacrificial gate structures 170 may be removed.

The interlayer insulating layer 190 may be formed by forming an insulating film covering the sacrificial gate structures 170 and the source/drain regions 150 and performing a planarization process.

The sacrificial layers 120 and the sacrificial gate structures 170 may be selectively removed with respect to the gate spacer layers 164, the interlayer insulating layer 190, and the first to third channel layers 141, 142, and 143. First, the sacrificial gate structures 170 may be removed to form upper gap regions UR, and then the sacrificial layers 120 exposed through the upper gap regions UR may be removed to form lower gap regions LR. For example, when the sacrificial layers 120 include silicon germanium (SiGe) and the first to third channel layers 141, 142, and 143 include silicon (Si), the sacrificial layers 120 may be selectively removed by performing a wet etching process using peracetic acid and/or a solution ($NH_4OH$:$H_2O_2$:$H_2O$=1:1:5) used in a Standard clean-1 (SC1) cleaning process as an etchant.

Figure 6G:
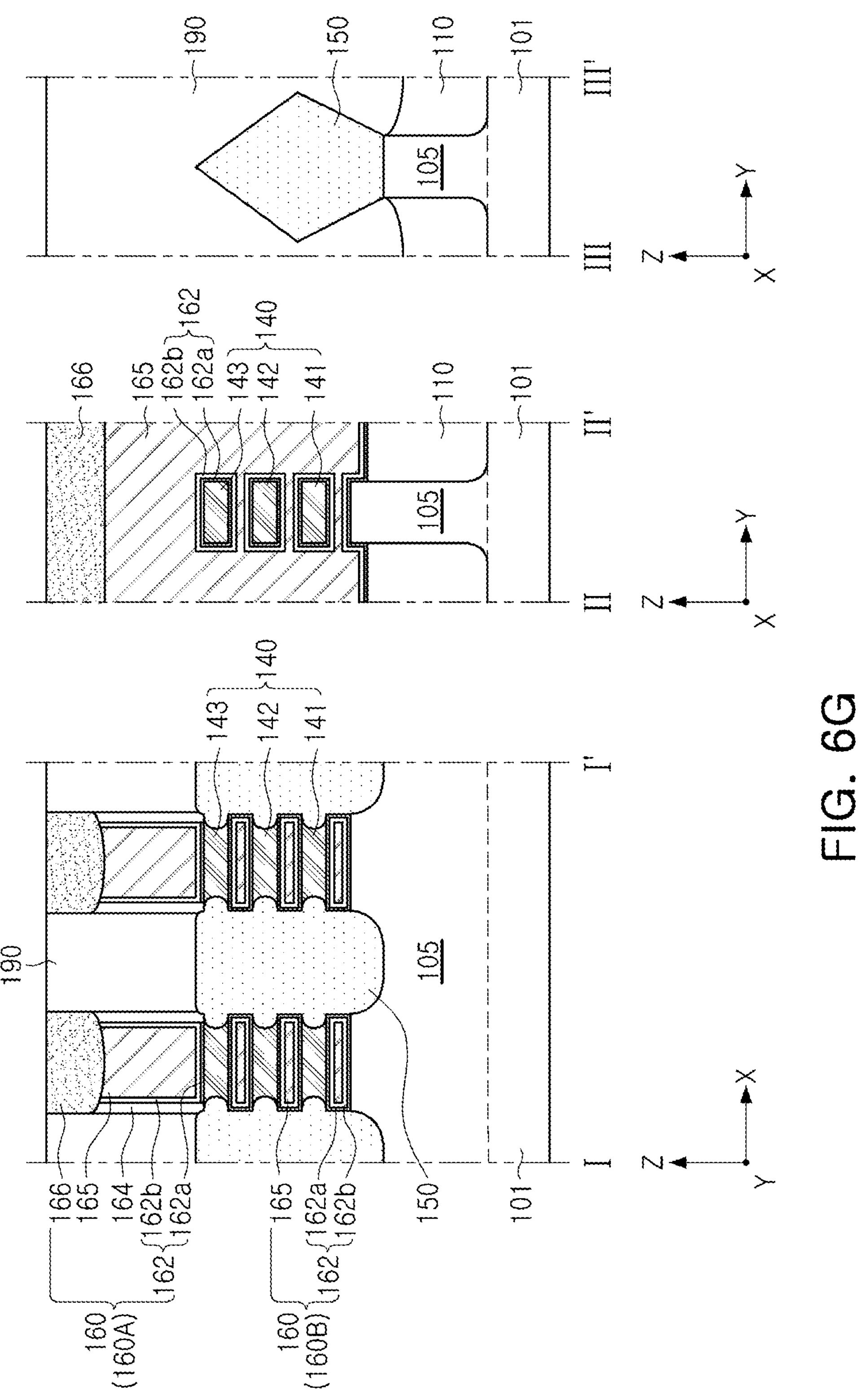

Referring to FIG. 6G, the gate structure 160 may be formed in the upper gap regions UR and the lower gap regions LR.

The first and second gate dielectric layers 162*a* and 162*b* may be formed to conformally cover inner surfaces of the upper gap regions UR and the lower gap regions LR. The gate electrode 165 may be formed to fill the upper gap regions UR and the lower gap regions LR. The gate electrode 165 and the gate spacer layers 164 may be removed to a predetermined depth from above the upper gap regions UR. The gate capping layer 166 may be formed in a region from which the gate electrode 165 and the gate spacer layers 164 are removed in the upper gap regions UR. Accordingly, the gate structure 160 including the first and second gate dielectric layers 162*a* and 162*b*, the gate electrode 165, the gate spacer layers 164, and the gate capping layer 166 may be formed.

Next, referring to FIG. 2A, the contact plugs 180 may be formed. The contact plug 180 may include the metal-semiconductor compound layer 182 disposed at the bottom, the barrier layer 184 disposed along sidewalls, and the plug conductive layer 186.

First, contact holes exposing the source/drain regions 150 may be formed by patterning the interlayer insulating layer 190. Next, the contact plugs 180 may be formed by filling the contact holes with a conductive material. In detail, after depositing a material forming the barrier layer 184 in the contact holes, a silicide process may be performed to form a metal-semiconductor compound layer 182, e.g., a silicide layer at the bottom surface. Next, the contact plugs 180 may be formed by depositing a conductive material to fill the contact holes. As a result, the semiconductor device 100 of FIGS. 1 and 2A may be manufactured.

Figure 7A:
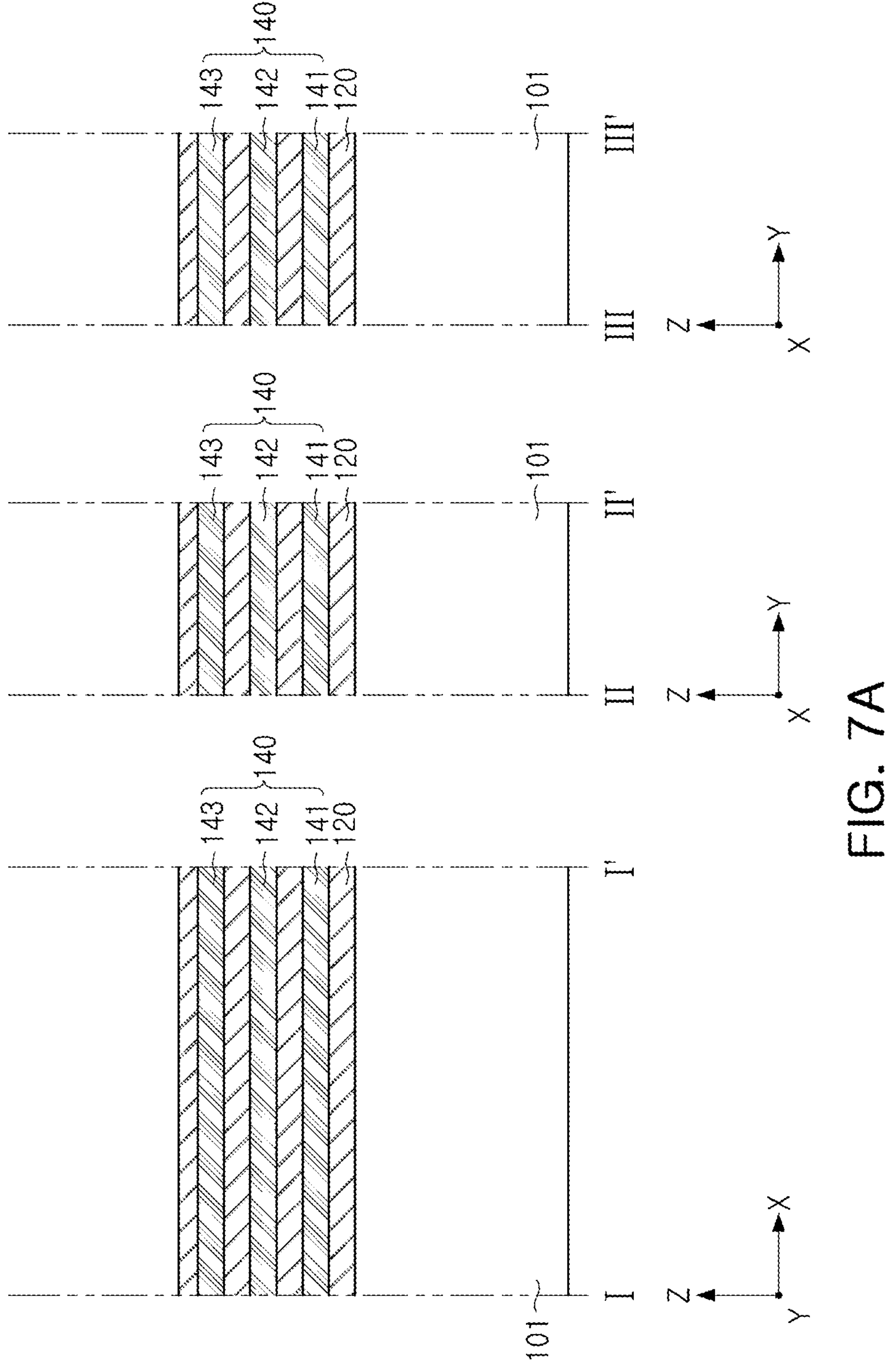
FIGS. 7A, 7B, and 7C are cross-sectional views illustrating stages in a manufacturing method of a semiconductor device according to example embodiments.
Figure 7B:
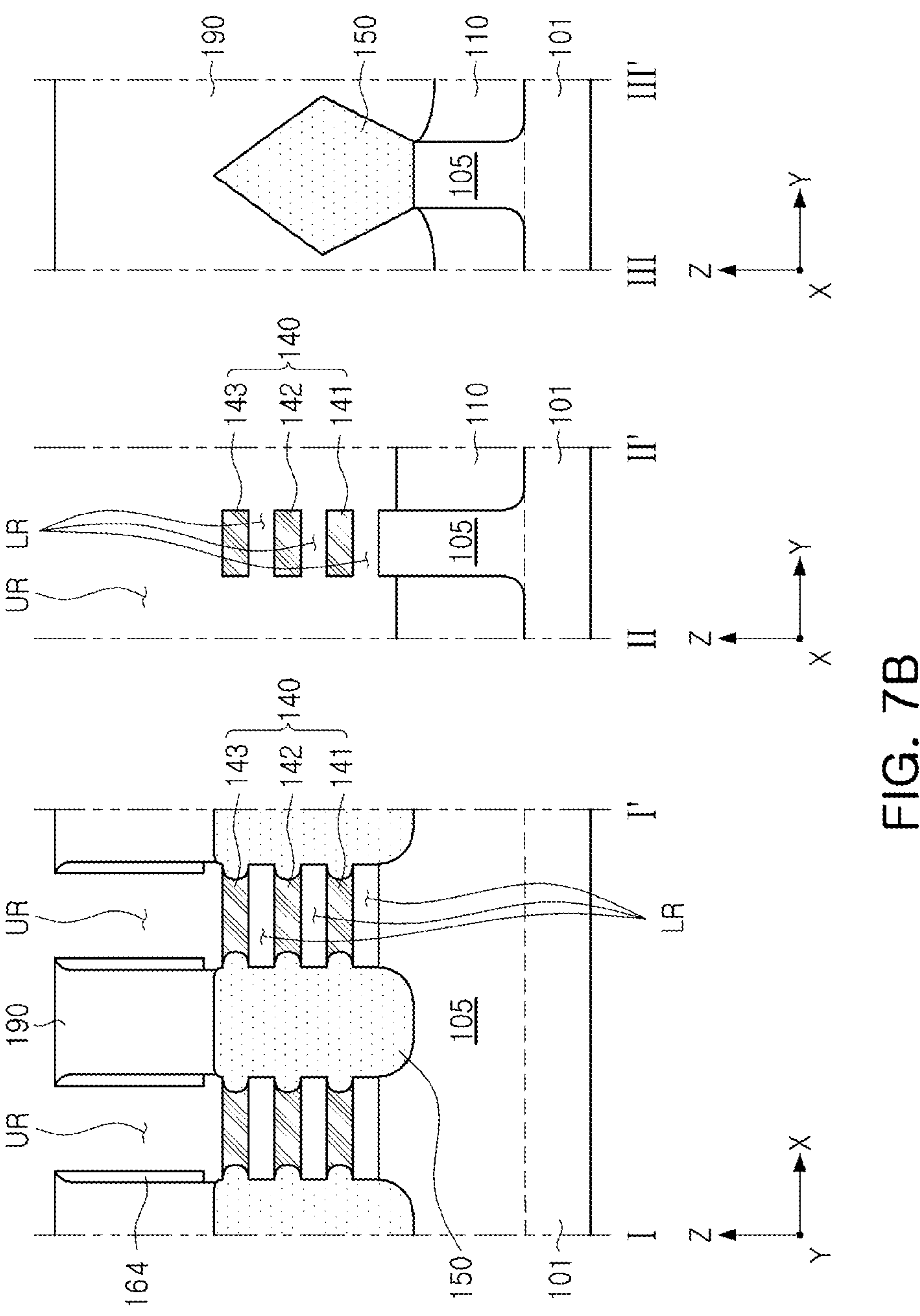
Figure 7C:
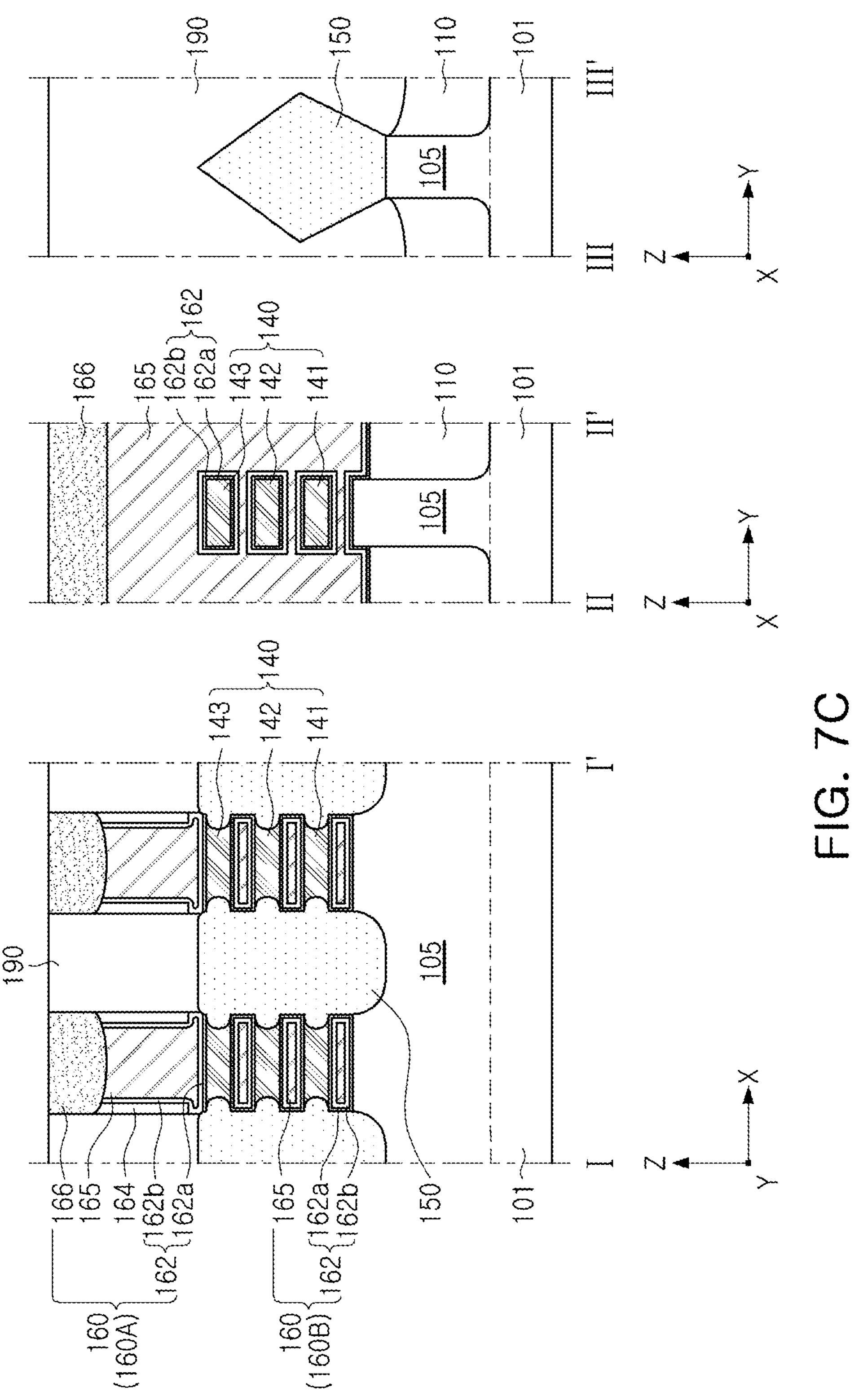

FIGS. 7A to 7C are cross-sectional views illustrating stages in a manufacturing method of the semiconductor device 100*h* of FIG. 5A according to example embodiments. In the following description, descriptions overlapping those described above with reference to FIGS. 6A to 6G will be omitted.

Referring to FIG. 7A, the sacrificial layers 120 and the first to third channel layers 141, 142, and 143 may be alternately stacked on the active region 105. However, an additional sacrificial layer 120 thinner than the sacrificial layers 120 of FIG. 6A may be further formed on the uppermost channel layer of the first to third channel layers 141, 142, and 143 of FIG. 6A. The additional sacrificial layer 120 may help form the source/drain region 150. Next, the same process as the above-described FIGS. 6B to 6E may be performed.

Referring to FIG. 7B, the interlayer insulating layer 190 may be formed, and the sacrificial layers 120 and the sacrificial gate structures 170 may be removed. During this process, as the additional sacrificial layer 120 (formed on the uppermost channel layer of the first to third channel layers 141, 142, and 143) is removed, the gate spacer layers 164 may be spaced apart from the uppermost channel layer among the first to third channel layers 141, 142, and 143.

Referring to FIG. 7C, the gate structure 160 may be formed in the upper gap regions UR and the lower gap regions LR. While performing the same process as in FIG. 6G, the first and second gate dielectric layers 162*a* and 162*b* may be formed to conformally cover inner surfaces of the upper gap regions UR and the lower gap regions LR. The second gate dielectric layer 162*b* may contact at least one of the interlayer insulating layer 190 and the source/drain region 150. When an upper surface of the source/drain region 150 is formed low, the gate spacer layers 164 may be spaced apart from the source/drain region 150. Next, as a process of forming the contact plugs 180 proceeds, the semiconductor device 100*h* as illustrated in FIG. 5A may be manufactured.

By way of summation and review, embodiments provide a semiconductor device having improved electrical characteristics. That is, as set forth above, according to an example embodiments, in a region perpendicularly overlapping a gate structure and a plurality of channel layers, a semiconductor device having improved electrical characteristics and reliability may be provided, by providing a structure in which a width of each of the plurality of channel layers in a first direction is less than a width of lower portions of the gate structure, adjacent to the respective channel layers among the lower portions of the gate structure in the first direction.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:

an active region extending on a substrate in a first direction;

channel layers on the active region, the channel layers being spaced apart from each other in a vertical direction perpendicular to an upper surface of the substrate;

a gate structure extending in a second direction and crossing the active region and the channel layers on the substrate, the gate structure respectively surrounding the channel layers; and source/drain regions on the active region on at least one side of the gate structure, the source/drain regions contacting the channel layers, wherein the gate structure includes:

an upper portion on an uppermost one of the channel layers, and lower portions between the channel layers in a region vertically overlapping the channel layers, a width of each of the channel layers in the first direction being less than a width of an adjacent one of the lower portions in the first direction, and wherein a first portion of surfaces at which the source/drain regions and the channel layers contact each other have a (111) crystal orientation.

2. The semiconductor device as claimed in claim 1, wherein each of the source/drain regions includes protruding portions protruding toward the channel layers at a substantially same level as the channel layers, respectively.

3. The semiconductor device as claimed in claim 1, wherein a lowermost portion of each of the source/drain regions is lower than a lowermost one of the lower portions of the gate structure.

4. The semiconductor device as claimed in claim 1, wherein:

the gate structure further includes a gate dielectric layer and a gate electrode on the gate dielectric layer, and in a region in which the gate structure and the channel layers vertically overlap each other, a minimum width in the first direction between opposite surfaces of at least one of the channel layers that contact the source/drain regions is less than a maximum width in the first direction of an adjacent one of the lower portions of the gate structure.

5. The semiconductor device as claimed in claim 4, wherein:

a minimum width in the first direction between opposite surfaces of at least one of the channel layers that contact the source/drain regions is less than a maximum width in the first direction of the gate electrode.

6. The semiconductor device as claimed in claim 1, wherein each of the source/drain regions includes:

a first epitaxial layer on the active region and in contact with the channel layers;

a second epitaxial layer on the first epitaxial layer, the second epitaxial layer being conformal to the first epitaxial layer; and a third epitaxial layer on the second epitaxial layer.

7. The semiconductor device as claimed in claim 6, wherein, on a central level of each of the channel layers, a distance from a side surface of each of the channel layers to an outer side surface of the third epitaxial layer in the first direction is a first distance, wherein, on a central level of each of the lower portions of the gate structure, a distance from an outer side surface of the first epitaxial layer to the outer side surface of the third epitaxial layer in the first direction is a second distance, and wherein the first distance is equal to or greater than the second distance.

8. The semiconductor device as claimed in claim 1, wherein a second portion of surfaces at which the source/drain regions and the channel layers contact each other have a (110) crystal orientation.

9. The semiconductor device as claimed in claim 1, wherein at least a third portion of surfaces at which the source/drain regions and the channel layers contact each other are parallel to the upper surface of the substrate.

10. The semiconductor device as claimed in claim 1, wherein at least a portion of surfaces at which the source/drain regions and the channel layers contact each other have a (111) crystal orientation.

11. The semiconductor device as claimed in claim 1, wherein at least a portion of surfaces at which the source/drain regions and the channel layers contact each other have a rounded shape.

12. The semiconductor device as claimed in claim 1, wherein:

the gate structure further includes a gate dielectric layer and a gate electrode on the gate dielectric layer, and in the upper portion of the gate structure, the gate dielectric layer is in contact with at least one of the source/drain regions and an interlayer insulating layer covering the source/drain regions.

13. The semiconductor device as claimed in claim 1, further comprising internal spacer layers on opposite sides of the gate structure in the first direction on a lower surface of each of the channel layers.

14. The semiconductor device as claimed in claim 13, wherein, in a region in which the gate structure and the channel layers vertically overlap each other, a minimum width between surfaces at which at least one of the channel layers and the source/drain regions contact each other in the first direction is less than a minimum width between surfaces at which the source/drain regions and the internal spacer layers contact each other in the first direction.

15. A semiconductor device, comprising:

an active region extending on a substrate in a first direction;

channel layers on the active region, the channels layers being spaced apart from each other in a vertical direction perpendicular to an upper surface of the substrate;

a gate structure extending in a second direction and crossing the active region and the channel layers on the substrate, the gate structure respectively surrounding the channel layers; and source/drain regions on the active region on at least one side of the gate structure, the source/drain regions contacting the channel layers, wherein at least a first portion of surfaces at which the source/drain regions and the channel layers contact each other have a (111) crystal orientation.

16. The semiconductor device as claimed in claim 15, wherein at least a portion of surfaces at which the source/drain regions and the active region contact each other have a (111) crystal orientation.

17. The semiconductor device as claimed in claim 15, wherein:

the gate structure includes a gate dielectric layer, and in a region in which the gate structure and the channel layers vertically overlap each other, the gate dielectric layer on an uppermost one of the channel layers is in contact with at least one of the source/drain regions and an interlayer insulating layer covering the source/drain regions.

18. The semiconductor device as claimed in claim 15, wherein a second portion of surfaces at which the source/drain regions and the channel layers contact each other have a (110) crystal orientation.

19. The semiconductor device as claimed in claim 15, further comprising internal spacer layers on opposite sides of the gate structure in the first direction on a lower surface of each of the channel layers.

20. A semiconductor device, comprising:

an active region extending on a substrate in a first direction;

channel layers on the active region, the channel layers being spaced apart from each other in a vertical direction perpendicular to an upper surface of the substrate;

a gate structure extending in a second direction and crossing the active region and the channel layers on the substrate, the gate structure respectively surrounding the channel layers; and source/drain regions on the active region on at least one side of the gate structure, the source/drain regions contacting the channel layers, wherein the gate structure includes an upper portion on an uppermost one of the channel layers and a lower portion below each of the channel layers, in a region vertically overlapping the channel layers, wherein a width of each of the channel layers in the first direction, on a central level of each of the channel layers, is less than a width between outer side surfaces of each of the source/drain regions, adjacent thereto in the first direction, on a central level of each of the lower portions of the gate structure, wherein at least a portion of surfaces at which the source/drain regions and the channel layers contact each other have a (111) crystal orientation, and wherein a lowermost portion of each of the source/drain regions is lower than a lowermost portion of the lower portions of the gate structure.

* * * * *